United States Patent
Lee et al.

(10) Patent No.: US 12,506,004 B2
(45) Date of Patent: Dec. 23, 2025

(54) METHOD OF MANUFACTURING A SEMICONDUCTOR DEVICE AND SEMICONDUCTOR DEVICE MANUFACTURING TOOL

(71) Applicant: TAIWAN SEMICONDUCTOR MANUFACTURING CO., LTD., Hsinchu (TW)

(72) Inventors: Peng-Ting Lee, Hsinchu (TW); Hui-Chun Lee, Hsinchu (TW); Jan-Liang Yang, Taichung (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 137 days.

(21) Appl. No.: 16/952,698

(22) Filed: Nov. 19, 2020

(65) Prior Publication Data
US 2021/0166937 A1    Jun. 3, 2021

Related U.S. Application Data

(60) Provisional application No. 62/942,655, filed on Dec. 2, 2019.

(51) Int. Cl.
*H01L 21/027*    (2006.01)
*G03F 7/38*    (2006.01)

(52) U.S. Cl.
CPC ............ *H01L 21/0274* (2013.01); *G03F 7/38* (2013.01)

(58) Field of Classification Search
CPC ..... H01L 21/0274; G03F 7/38; G03F 7/0043; G03F 7/0042; G03F 7/004
See application file for complete search history.

(56) References Cited

U.S. PATENT DOCUMENTS

| | | | | | |
|---|---|---|---|---|---|
| 4,900,696 | A | * | 2/1990 | Ito | G03F 7/265 438/780 |
| 5,272,112 | A | * | 12/1993 | Schmitz | C23C 16/14 438/680 |
| 6,002,108 | A | * | 12/1999 | Yoshioka | G03F 7/38 219/388 |

(Continued)

FOREIGN PATENT DOCUMENTS

| | | | |
|---|---|---|---|
| JP | 05109697 A | * | 4/1993 |
| JP | 06275509 A | * | 9/1994 |

(Continued)

OTHER PUBLICATIONS

Https://www.lenntech.com/calculators/humidity/relative-humidity.htm (Year: 2023).*

*Primary Examiner* — Jonathan Johnson
*Assistant Examiner* — Alexander N. Lee
(74) *Attorney, Agent, or Firm* — STUDEBAKER BRACKETT PLLC

(57) ABSTRACT

A method of manufacturing a semiconductor device includes forming a photoresist layer including a photoresist composition over a substrate. The photoresist layer is selectively exposed to actinic radiation. The photoresist layer is heated after selectively exposing the photoresist layer to actinic radiation. During the heating, the photoresist layer is exposed to an ambient of greater than 45% relative humidity. The photoresist layer is developed after the heating to form a pattern in the photoresist layer.

19 Claims, 28 Drawing Sheets

(56) References Cited

U.S. PATENT DOCUMENTS

| | | | | |
|---|---|---|---|---|
| 6,040,120 | A * | 3/2000 | Matsushita | H01L 21/0274 55/385.2 |
| 7,771,246 | B2 | 8/2010 | Hirai et al. | |
| 2002/0113056 | A1* | 8/2002 | Sugaya | H01L 21/67248 219/390 |
| 2008/0032426 | A1* | 2/2008 | Michaelson | H01L 22/12 257/E21.53 |
| 2008/0220379 | A1* | 9/2008 | Nomura | G03F 7/38 355/27 |
| 2009/0069521 | A1* | 3/2009 | Nagai | C07C 309/10 526/287 |
| 2012/0208127 | A1* | 8/2012 | Hatakeyama | G03F 7/0043 430/296 |
| 2016/0033864 | A1* | 2/2016 | Wang | G03F 7/0382 430/325 |
| 2017/0029547 | A1* | 2/2017 | Hatakeyama | C08F 220/68 |
| 2018/0164689 | A1* | 6/2018 | Sano | G03F 7/38 |

FOREIGN PATENT DOCUMENTS

| | | |
|---|---|---|
| TW | 200644075 A | 12/2006 |
| TW | 201905608 A | 2/2019 |
| TW | 201936613 A | 9/2019 |

* cited by examiner

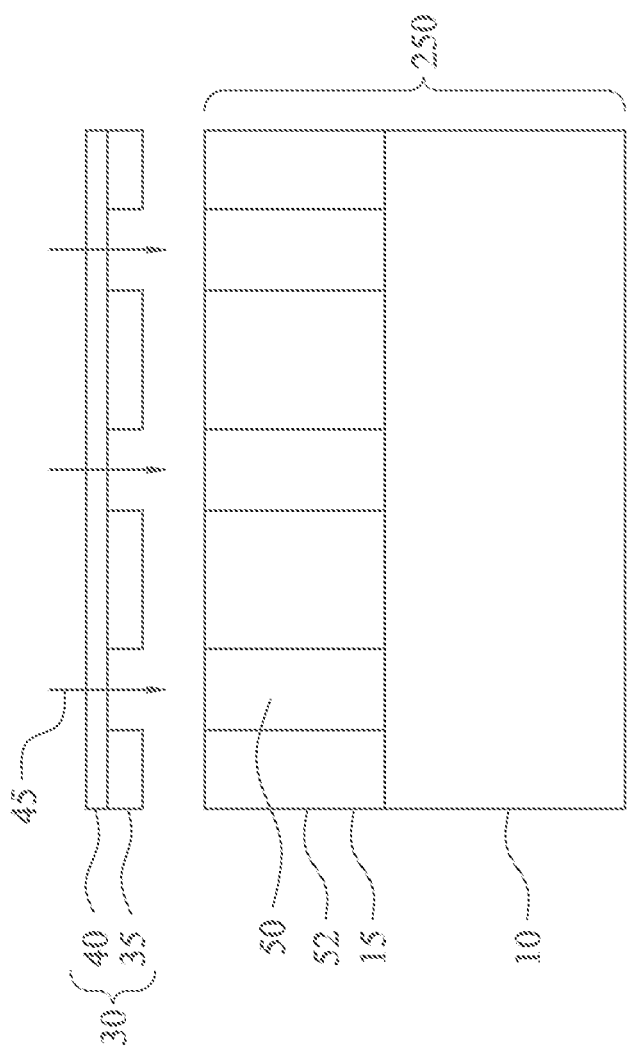

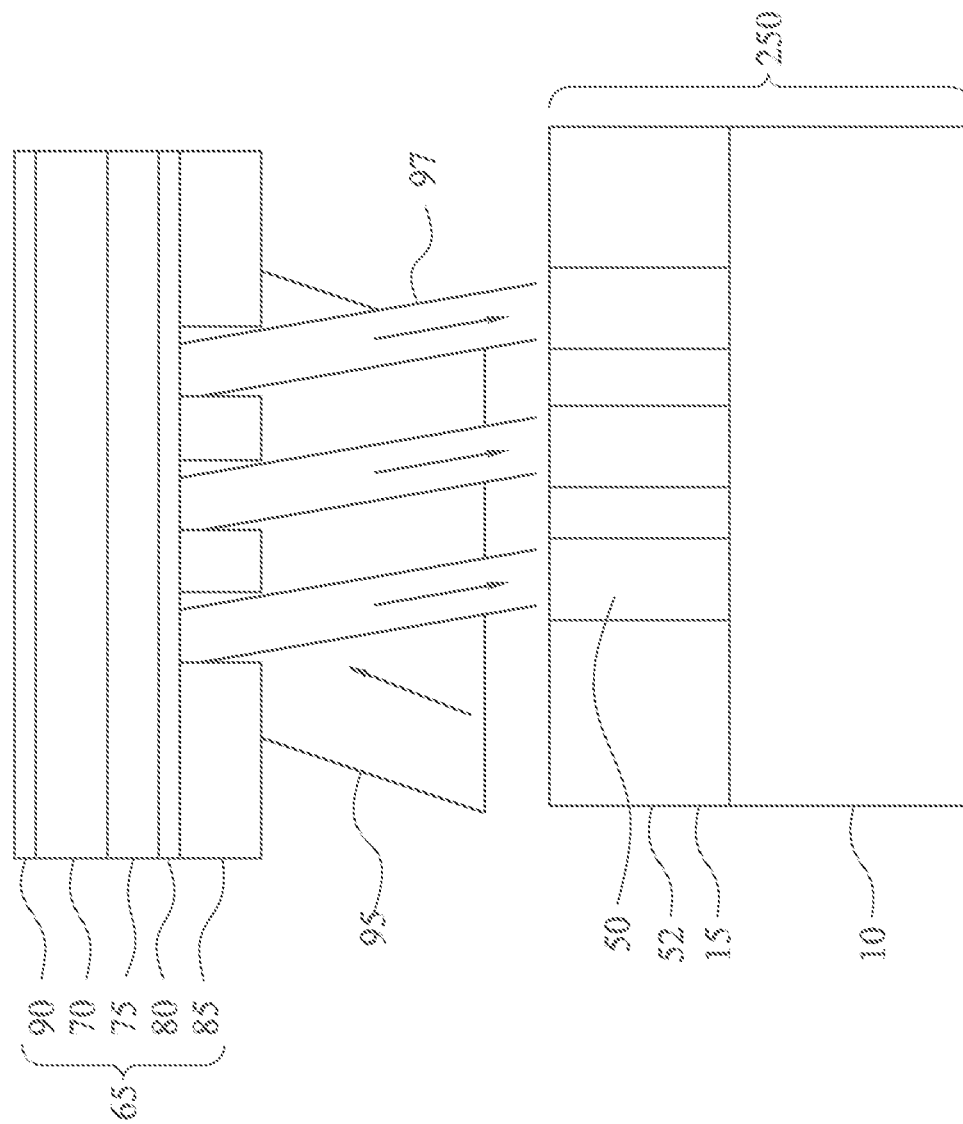

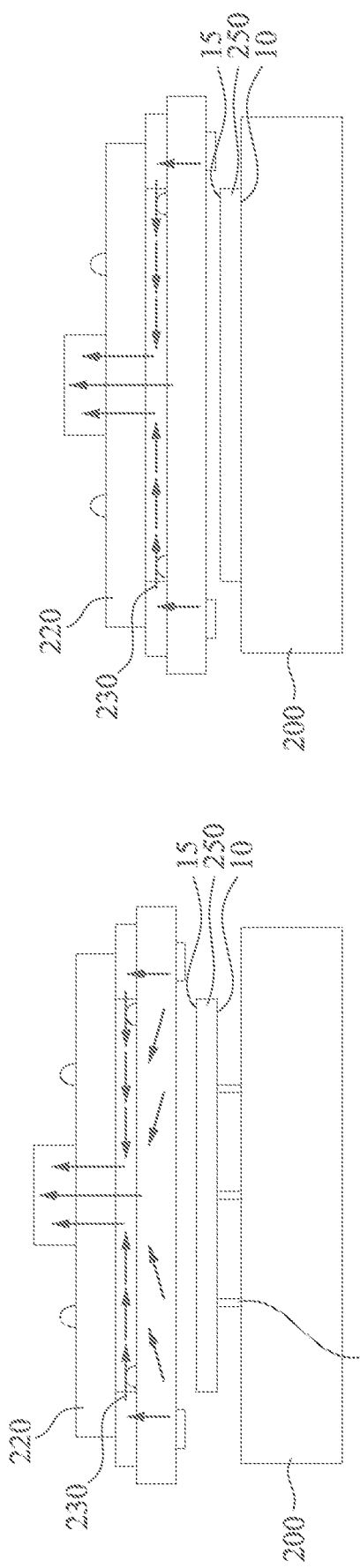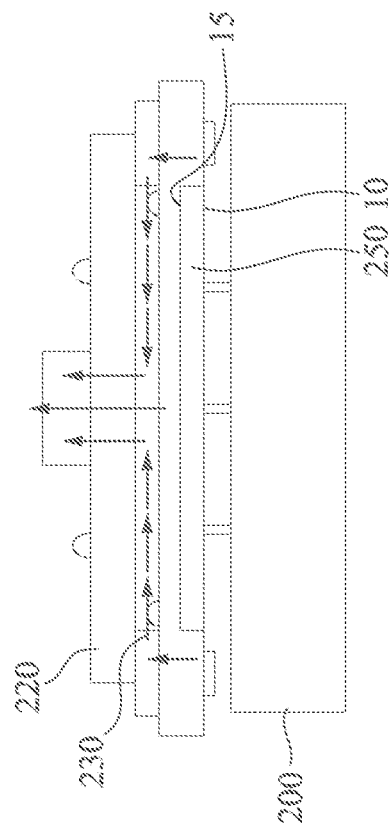

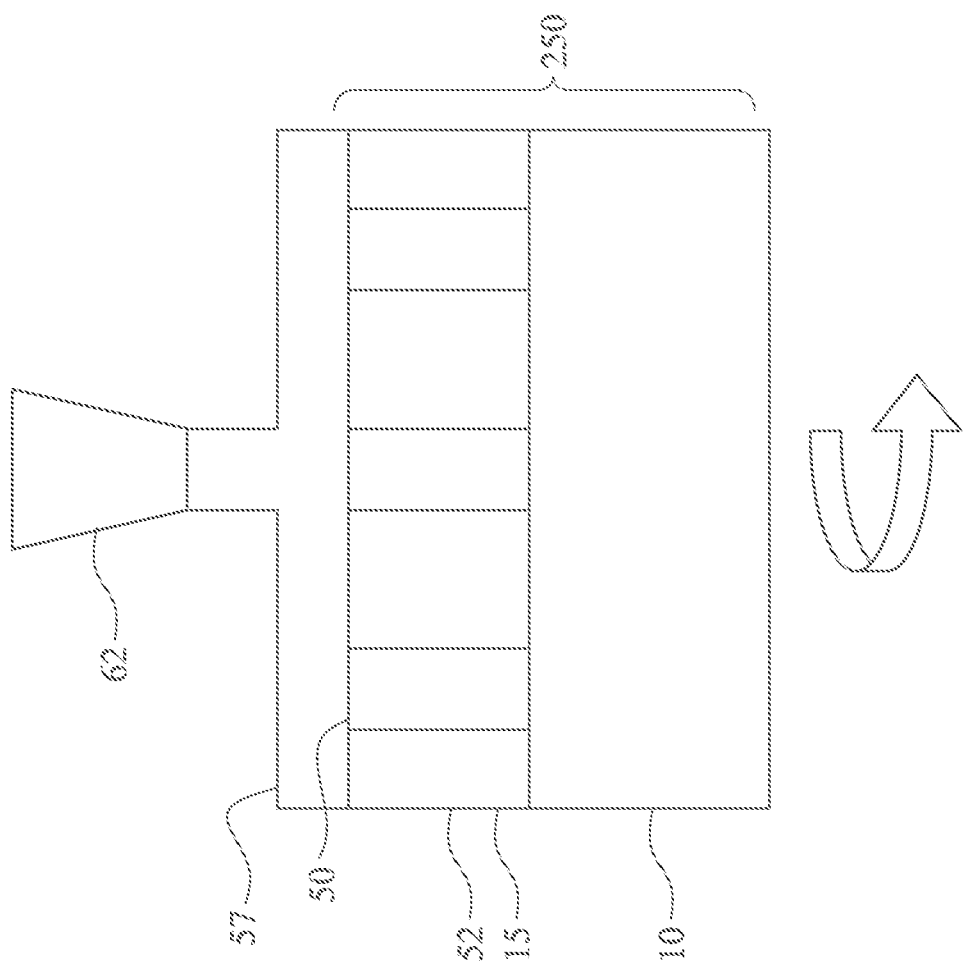

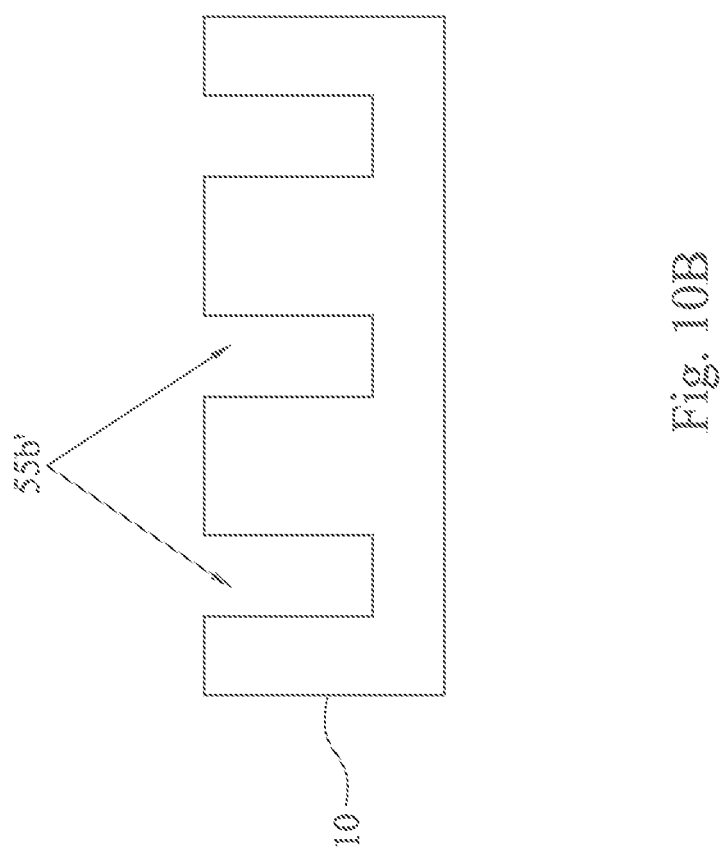

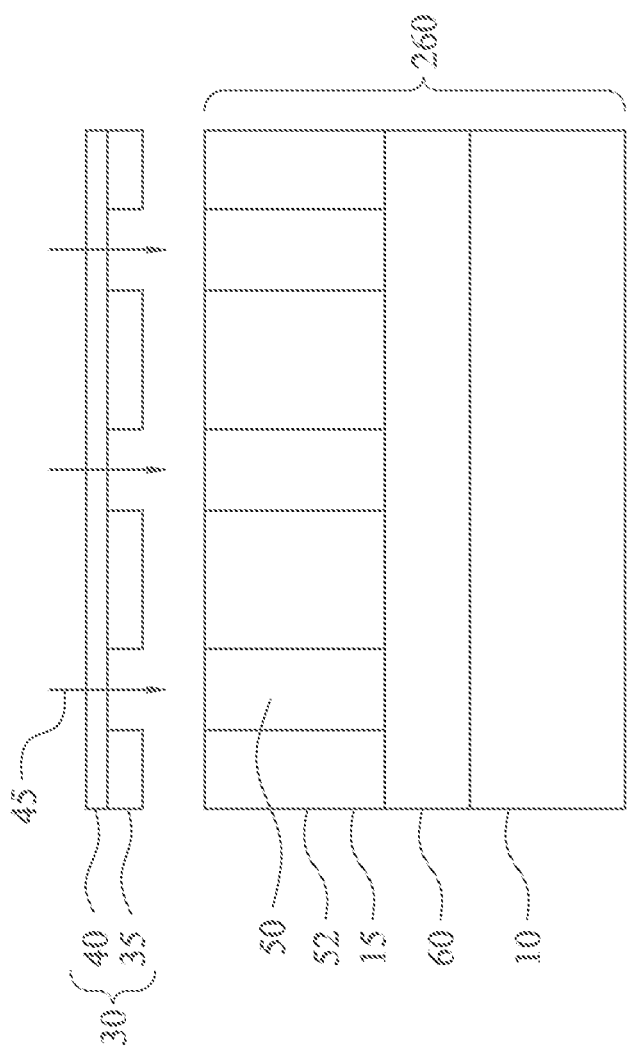

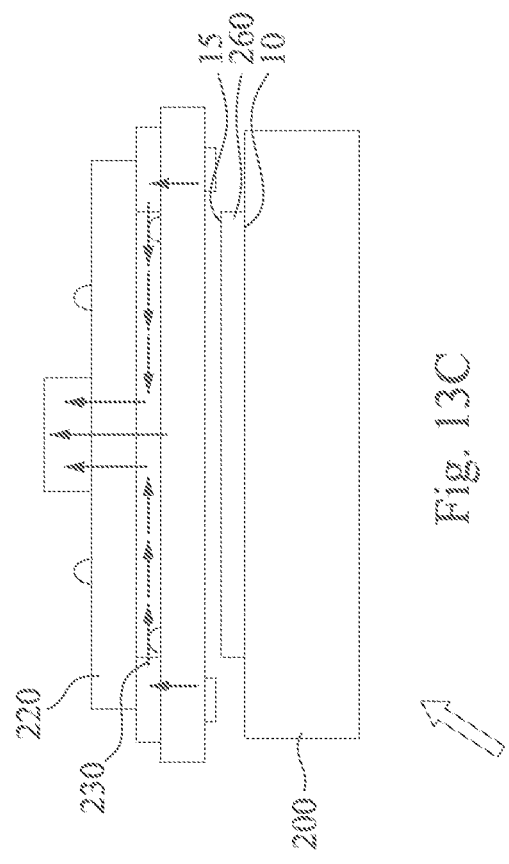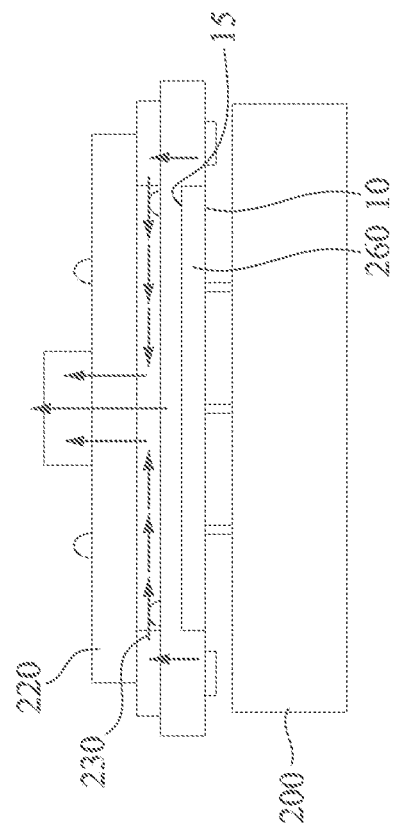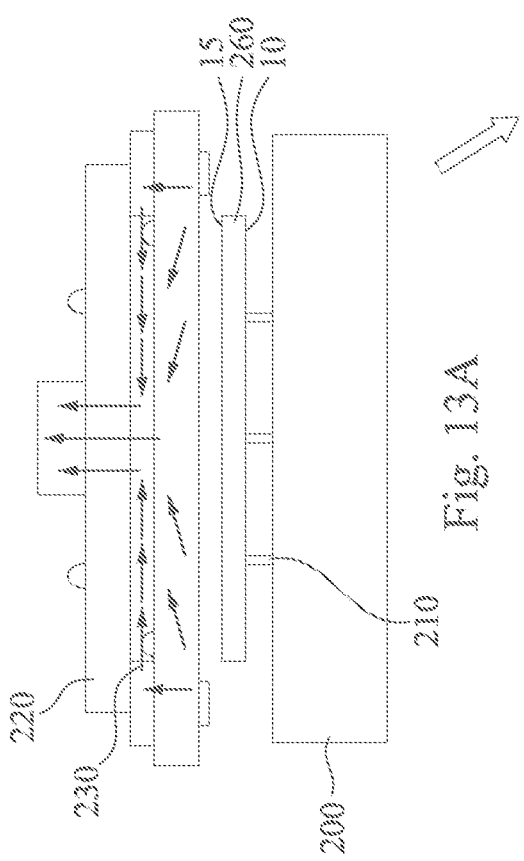

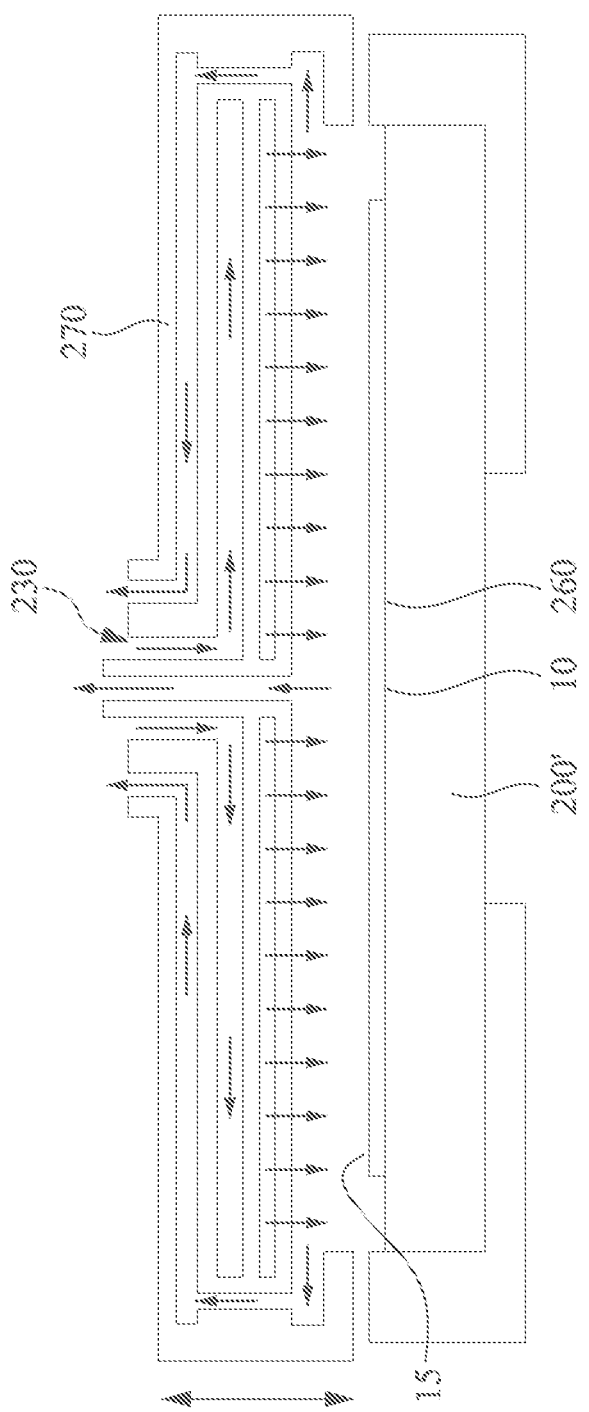

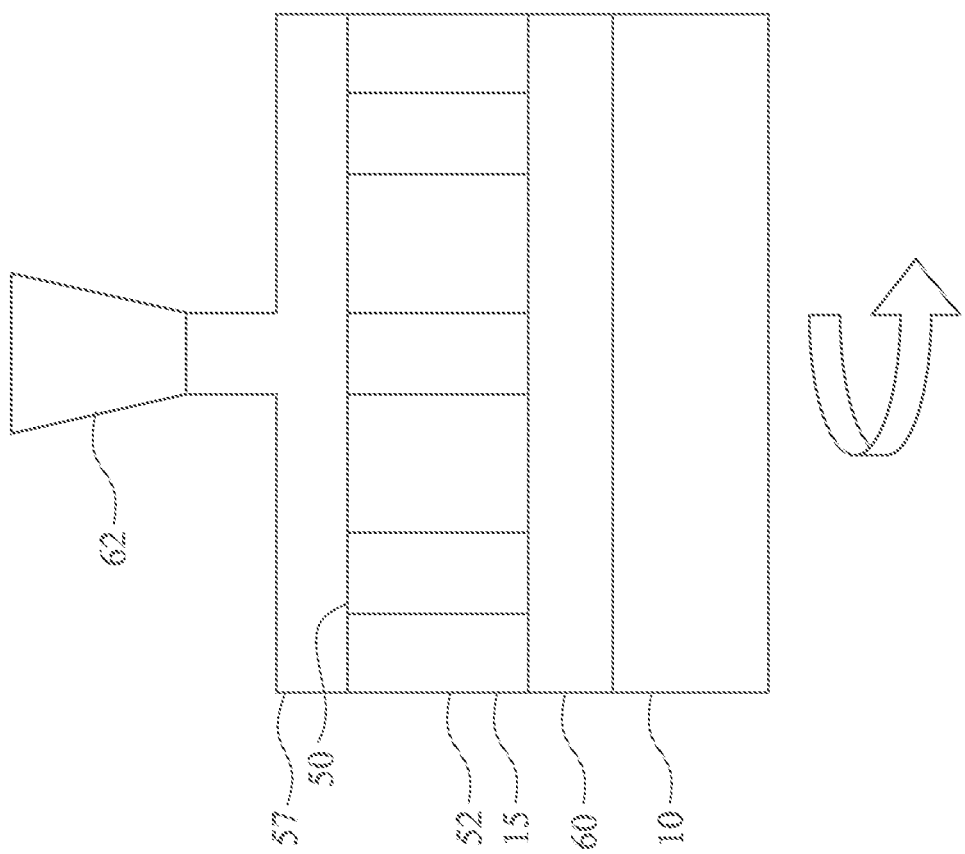

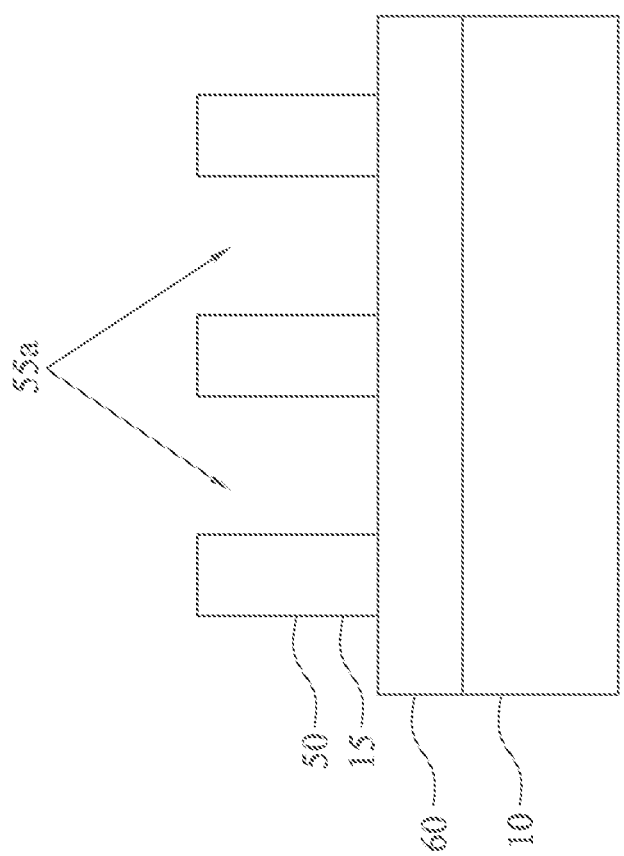

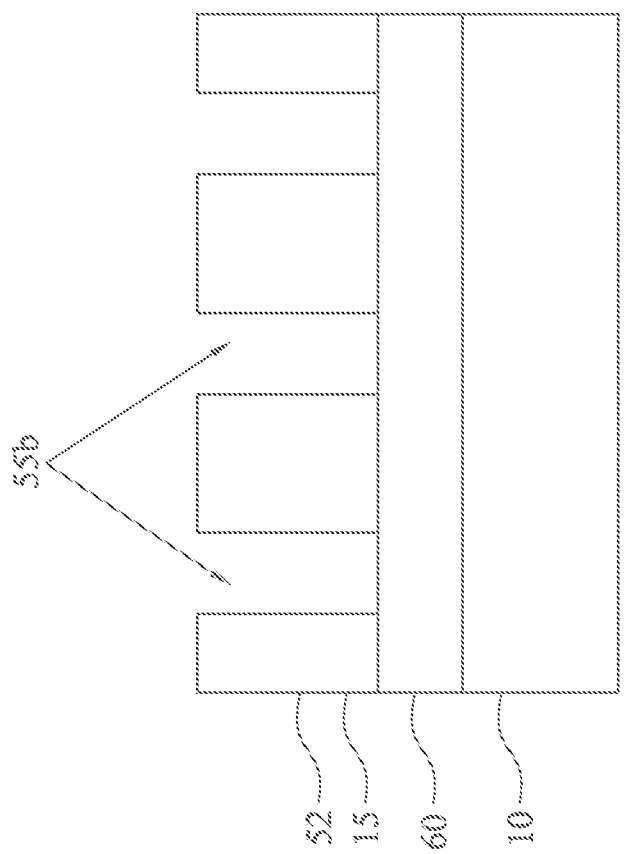

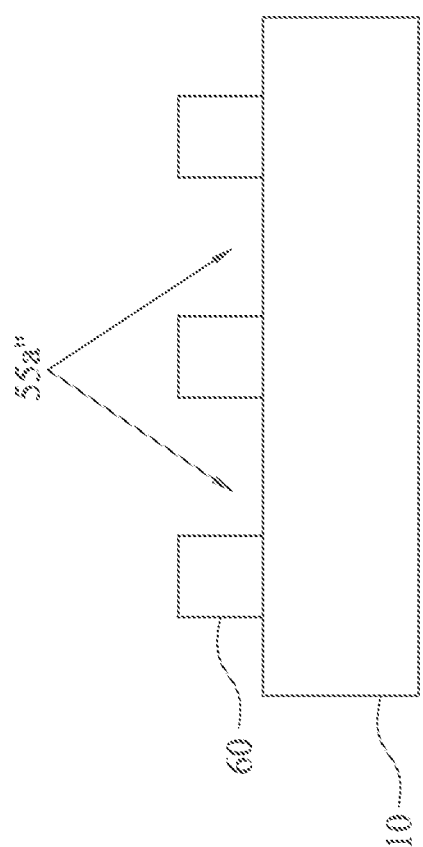

|  | Trial #1 | | | | Trial #2 | | | |
|---|---|---|---|---|---|---|---|---|
| PEB Delay Time (hr) | 0 | 3 | 6 | 21 | 0 | 3 | 6 | 21 |
| CD Mean (nm) | 15.2 | 15.2 | 15 | 15 | 14.8 | 14.7 | 14.7 | 14.8 |
| Normalized CDU | 0.7 | 0.9 | 0.8 | 0.9 | 0.7 | 0.8 | 1 | 1.1 |
| Range (nm) | 1.2 | 1.7 | 1.5 | 1.4 | 1.4 | 1.4 | 1.8 | 1.6 |
| Normalized LWR | 1.0 | 1.0 | 1.0 | 1.0 | 1.0 | 1.0 | 1.0 | 1.0 |
| Normalized CD Mean Range 24 hour PEB delay | 0.4 | | | | 0.2 | | | |

Fig. 20

METHOD OF MANUFACTURING A SEMICONDUCTOR DEVICE AND SEMICONDUCTOR DEVICE MANUFACTURING TOOL

CROSS-REFERENCE TO RELATED APPLICATION

This application claims priority to U.S. Provisional Patent Application No. 62/942,655, filed Dec. 2, 2019, the entire disclosure of which is incorporated herein by reference.

BACKGROUND

As consumer devices have gotten smaller and smaller in response to consumer demand, the individual components of these devices have necessarily decreased in size as well. Semiconductor devices, which make up a major component of devices such as mobile phones, computer tablets, and the like, have been pressured to become smaller and smaller, with a corresponding pressure on the individual devices (e.g., transistors, resistors, capacitors, etc.) within the semiconductor devices to also be reduced in size.

One enabling technology that is used in the manufacturing processes of semiconductor devices is the use of photolithographic materials. Such materials are applied to a surface of a layer to be patterned and then exposed to an energy that has itself been patterned. Such an exposure modifies the chemical and physical properties of the exposed regions of the photosensitive material. This modification, along with the lack of modification in regions of the photosensitive material that were not exposed, can be exploited to remove one region without removing the other.

However, as the size of individual devices has decreased, process windows for photolithographic processing has become tighter and tighter. As such, advances in the field of photolithographic processing are necessary to maintain the ability to scale down the devices, and further improvements are needed in order to meet the desired design criteria such that the march towards smaller and smaller components may be maintained.

As the semiconductor industry has progressed into nanometer technology process nodes in pursuit of higher device density, higher performance, and lower costs, there have been challenges in reducing semiconductor feature size. Extreme ultraviolet lithography (EUVL) has been developed to form smaller semiconductor device feature size and increase device density on a semiconductor wafer. In order to improve EUVL an increase in wafer exposure throughput is desirable. Wafer exposure throughput can be improved through increased exposure power or increased resist photospeed. Low exposure dose may lead to increased line width roughness and reduced critical dimension uniformity.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 3A and 3B show a process stage of a sequential operation according to an embodiment of the disclosure.

FIGS. 4A, 4B, and 4C show process stages of sequential operations according to an embodiment of the disclosure.

FIG. 8 shows a process stage of a sequential operation according to an embodiment of the disclosure.

FIGS. 10A and 10B show process stages of sequential operations according to an embodiment of the disclosure.

FIGS. 12A and 12B show process stages of a sequential operation according to embodiments of the disclosure.

FIGS. 13A, 13B, and 13C show process stages of a sequential operation according to embodiments of the disclosure. FIG. 13D shows an alternative arrangement for use in embodiments of the disclosure.

FIG. 14 shows a process stage of a sequential operation according to an embodiment of the disclosure.

FIGS. 15A and 15B show process stages of a sequential operation according to an embodiment of the disclosure.

FIGS. 16A and 16B show process stages of a sequential operation according to an embodiment of the disclosure.

FIG. 20 includes data of trials according to embodiments of the disclosure.

DETAILED DESCRIPTION

It is to be understood that the following disclosure provides many different embodiments, or examples, for implementing different features of the disclosure. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s)

as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of."

Metal-containing photoresists are desirable as high-sensitivity and high-etching selectivity photoresists. The metal particles in the metal-containing photoresists absorb high energy photons, such as extreme ultraviolet EUV photons. Metal containing photoresists include metal particles and ligands to complex the metal particles. In some embodiments, the metal particles are nanoparticles, and in some embodiments, the metal particles are metal oxide particles. In some embodiments, a metallic core including one or more metal nanoparticles is complexed by a plurality of ligand units forming a ligand-complexed metallic core.

Figure 1:
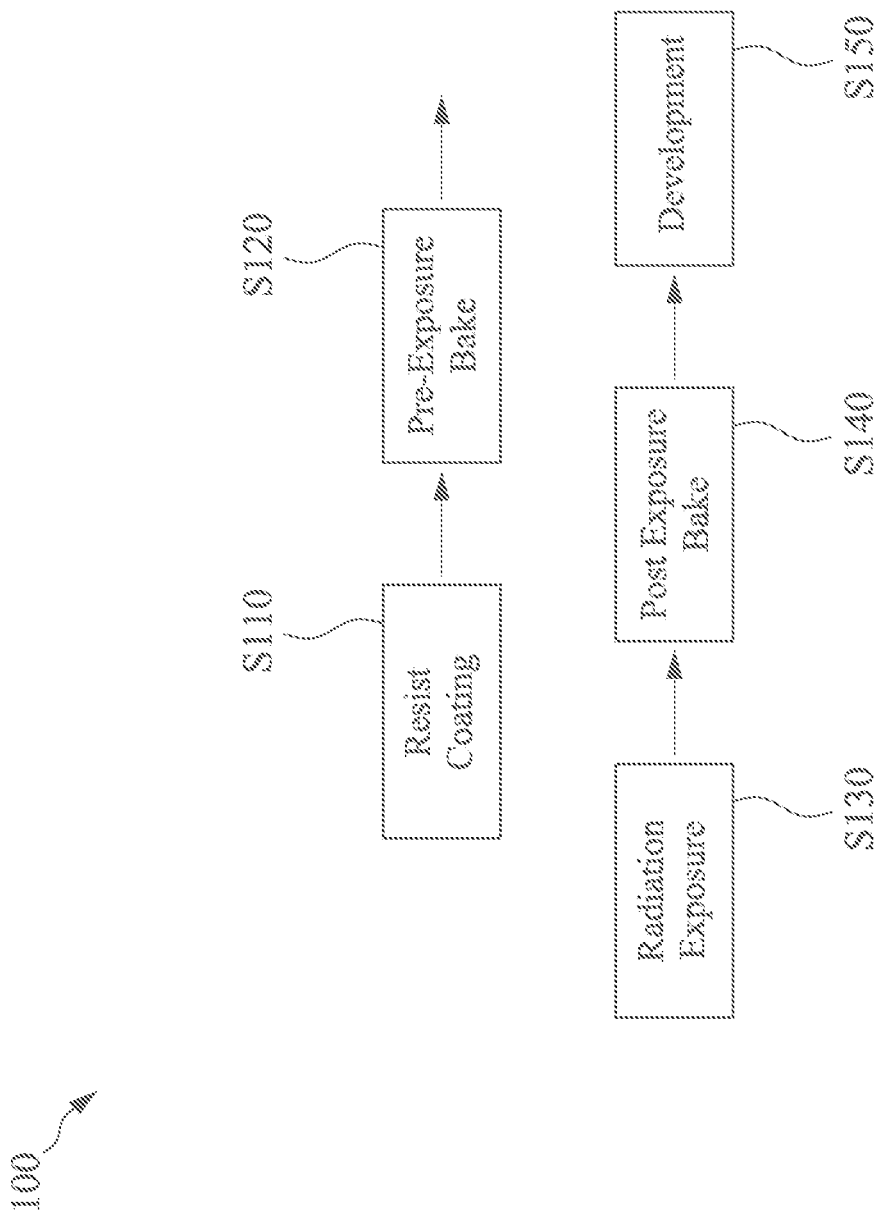
FIG. 1 illustrates a process flow of manufacturing a semiconductor device according to embodiments of the disclosure.

FIG. 1 illustrates a process flow 100 of manufacturing a semiconductor device according to embodiments of the disclosure. In operation S110, a resist composition is prepared. In some embodiments, the resist is a photoresist.

Figure 2:
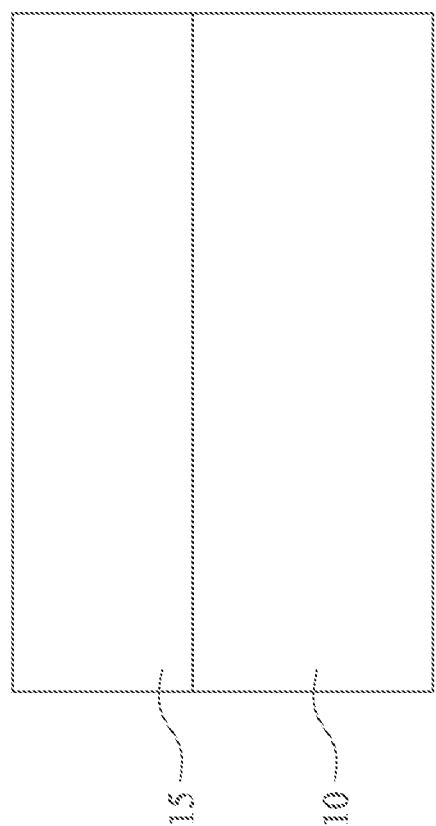
FIG. 2 shows a process stage of a sequential operation according to an embodiment of the disclosure.

The photoresist composition is coated on a surface of a layer to be patterned or a substrate 10 in operation S110, in some embodiments, to form a resist layer 15, as shown in FIG. 2. In some embodiments, the resist layer 15 is a photoresist layer. Then, the resist layer 15 undergoes a first baking operation S120 to evaporate solvents in the resist composition in some embodiments. The resist layer 15 is baked at a temperature and time sufficient to cure and dry the resist layer 15 (pre-baking). In some embodiments, the resist layer is heated to a temperature of about 40° C. to 120° C. for about 10 seconds to about 10 minutes.

After the first (or pre-) baking operation S120, the photoresist layer 15 is selectively exposed to actinic radiation 45/97 (see FIGS. 3A and 3B) in operation S130. In some embodiments, the photoresist layer 15 is selectively exposed to ultraviolet radiation. In some embodiments, the ultraviolet radiation is deep ultraviolet radiation (DUV). In some embodiments, the ultraviolet radiation is extreme ultraviolet (EUV) radiation. In some embodiments, the actinic radiation is an electron beam.

As shown in FIG. 3A, the exposure radiation 45 passes through a photomask 30 before irradiating the photoresist layer 15 in some embodiments. In some embodiments, the photomask has a pattern to be replicated in the photoresist layer 15. The pattern is formed by an opaque pattern 35 on the photomask substrate 40, in some embodiments. The opaque pattern 35 may be formed by a material opaque to ultraviolet radiation, such as chromium, while the photomask substrate 40 is formed of a material that is transparent to ultraviolet radiation, such as fused quartz.

In some embodiments, the selective exposure of the photoresist layer 15 to form exposed regions 50 and unexposed regions 52 is performed using extreme ultraviolet lithography. In an extreme ultraviolet lithography operation a reflective photomask 65 is used to form the patterned exposure light in some embodiments, as shown in FIG. 3B. The reflective photomask 65 includes a low thermal expansion glass substrate 70, on which a reflective multilayer 75 of Si and Mo is formed. A capping layer 80 and absorber layer 85 are formed on the reflective multilayer 75. A rear conductive layer 90 is formed on the back side of the low thermal expansion glass substrate 70. In extreme ultraviolet lithography, extreme ultraviolet radiation 95 is directed towards the reflective photomask 65 at an incident angle of about 6°. A portion 97 of the extreme ultraviolet radiation is reflected by the Si/Mo multilayer 75 towards the photoresist coated substrate 10, while the portion of the extreme ultraviolet radiation incident upon the absorber layer 85 is absorbed by the photomask. In some embodiments, additional optics, including mirrors, are between the reflective photomask 65 and the photoresist coated substrate.

The region of the photoresist layer exposed to radiation 50 undergoes a chemical reaction thereby changing its solubility in a subsequently applied developer relative to the region of the photoresist layer not exposed to radiation 52. In some embodiments, the portion of the photoresist layer exposed to radiation 50 undergoes a crosslinking reaction.

Next, the photoresist layer 15 undergoes a second baking operation (or post-exposure bake) in operation S140. In some embodiments, the photoresist layer 15 is heated to a temperature of about 70° C. to 160° C. for about 20 seconds to about 120 seconds. The post-exposure baking may be used in order to assist in the generating, dispersing, and reacting of the acid/base/free radical generated from the impingement of the radiation 45/97 upon the photoresist layer 15 during the exposure. Such assistance helps to create or enhance chemical reactions, which generate chemical differences between the exposed region 50 and the unexposed region 52 within the photoresist layer. These chemical differences also cause differences in the solubility between the exposed region 50 and the unexposed region 52.

Control of the humidity of the ambient in which the substrates with exposed photoresist layers are stored during post-exposure bake is needed to prevent unacceptable critical dimension variation in the patterned photoresist. Increased humidity levels during the post-exposure bake enhances the chemical reaction between water and the exposed photoresist layer. Higher humidity levels enable the photoresist to stabilize in a shorter time period, thereby reducing wafer-to-wafer critical dimension variability and decreasing line width roughness. In addition, increased humidity levels increases the post-exposure bake delay tolerance without sacrificing critical dimension and line width roughness. Higher humidity levels stabilize the intermediate products and make cross linking reactions more efficient. Ambient humidity levels of greater than about 45% relative humidity are desirable in some embodiments.

FIGS. 4A, 4B, and 4C illustrate sequential operations of the post-exposure baking operation according to embodiments of the disclosure. FIGS. 4A, 4B, and 4C show a photoresist coated substrate 250 undergoing a post-exposure bake (or heating) operation. The photoresist coated substrate 250 is placed over a heating element 200. In some embodiments, the heating element 200 is a hot plate. The photoresist coated substrate 250 is supported by support pins 210. A manifold 220 with a humid gas flow 230 is located above the photoresist coated substrate 250. In some embodiments, the humid gas flow 230 enters the manifold 220 at edge portions of the manifold, and the humid gas flows across a surface of the photoresist layer 15 from the periphery of the photoresist layer. The humid gas flow 230 subsequently exits the manifold from a central portion of the manifold, as shown in FIGS. 4A-4C.

The manifold 220 is lowered relative to the photoresist coated substrate 250 so that the humid gas 230 flows over the photoresist coated substrate 250 in some embodiments, as shown in FIG. 4B. The support pins are subsequently lowered, as shown in FIG. 4C and the photoresist coated substrate 250 is brought into contact with the heating element 200 in some embodiments.

In some embodiments, the photoresist layer 15 is exposed to an ambient of greater than about 45% relative humidity. In other embodiments, the photoresist layer 15 is exposed to an ambient of about 50% to about 95% relative humidity. In other embodiments, the photoresist layer 15 is exposed to an ambient of about 60% to about 75% relative humidity. Relative humidities of the gas outside the ranges disclosed herein may result in photoresist patterns having decreased critical dimension uniformity and increased line width roughness.

In some embodiments during the post-exposure baking (heating), the photoresist layer 15 is heated at a temperature in a range of about 40° C. to about 175° C. by controlling the temperature of the heating element 200. In some embodiments, during the post-exposure baking (heating) the photoresist layer 15 is heated at a temperature in a range of about 60° C. to 160° C. In some embodiments, during the post-exposure baking, the photoresist layer 15 is heated at a temperature in a range of about 100° C. to about 150° C.

In some embodiments, during the post-exposure baking, the photoresist layer 15 is heated for about 45 seconds to about 180 seconds. In some embodiments, the photoresist layer 15 is heated for about 60 seconds to about 120 seconds. The duration of heating the photoresist coated substrate includes the total elapsed time during the post-exposure baking operation illustrated in FIGS. 4A-4C. The humid gas 230 is flowing over the photoresist coated substrate 250 throughout the post-exposure baking (heating) operations illustrated in FIG. 4A-4C.

In some embodiments, during the post-exposure baking, the photoresist coated substrate 250 is supported above a surface of a heating element 200. In some embodiments, during the post-exposure baking, the substrate 250 is supported above and spaced-apart from the heating element 200 for about 15 seconds to about 60 seconds and then brought into contact with the heating element 200. In some embodiments, the substrate 250 is supported above and spaced-apart from the heating element 200 for about 20 seconds to about 40 seconds and then brought into contact with the heating element. In some embodiments, the substrate 250 is supported above and spaced-apart from the heating element 200 for about 30 seconds. In some embodiments, during the post-exposure baking, the substrate 250 is supported at a height of about 0.5 mm to about 10 mm above a surface of a heating element 200. In other embodiments, during the post-exposure baking, the substrate 250 is supported at a height of about 2 mm to about 6 mm above a surface of the heating element 250. In other embodiments, during the post-exposure baking, the substrate 250 is supported at a height of about 4 mm above a surface of the heating element 200. Post-exposure baking at temperatures and for durations of times outside the ranges disclosed herein may result in photoresist patterns having decreased critical dimension uniformity and increased line width roughness.

In some embodiments, the gas having greater than 45% relative humidity is supplied over the photoresist layer at a flow rate ranging from about 1 L/min to about 25 L/min. In some embodiments, the gas flow rate ranges from about 3 L/min to about 12 L/min. In other embodiments, the gas flow rate is about 6 L/min. Humid gas flow rates outside the ranges disclosed herein may result in photoresist patterns having decreased critical dimension uniformity and increased line width roughness.

Supporting the photoresist coated substrate 250 above the heating element 200 for a period of time enables the humid ambient to interact with the photoresist layer 15 and stabilize the photoresist layer, while preventing unwanted cross-linking reactions in certain regions, such as the unexposed regions 52, as a result of overheating during the post-exposure baking operation. As a result, negative impacts on critical dimension uniformity and line width roughness are prevented.

In some embodiments, the humid ambient includes water vapor and at least one of air, nitrogen, argon, helium, neon, or carbon dioxide.

Figure 4D:
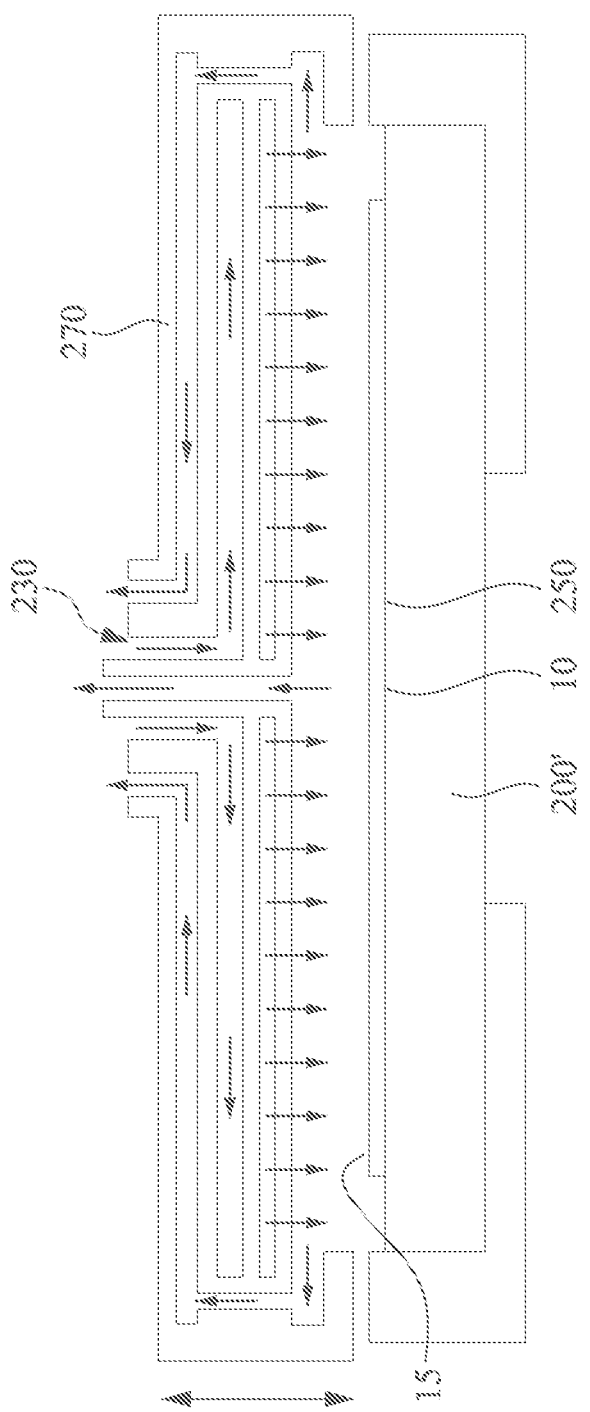
FIG. 4D shows an alternative arrangement for use in embodiments of the disclosure.

In some embodiments, a gas showerhead 270 is used as the manifold, as shown in FIG. 4D. In some embodiments, the photoresist coated substrate 250 is placed on a heating element 200' and the humid gas flow 230 enters the gas showerhead from a central region. The humid gas flow 230 subsequently impinges on the photoresist coated substrate 250 through openings in the face of the gas showerhead 270 opposing the photoresist coated substrate 250. In some embodiments, the use of the gas showerhead 270 minimizes turbulence of the humid gas flow 230, and provides improved temperature control over the photoresist coated substrate 250. In some embodiments, the use of the gas showerhead 270 reduces the exhaust rate and minimizes contamination.

In an embodiment, a surface of the showerhead 270 facing the photoresist layer 15 on the photoresist coated substrate 250 is spaced-apart from the main surface of the photoresist layer by a distance ranging from about 1 mm to about 25 mm. In some embodiments, the surface of the showerhead 270 facing the photoresist layer 15 is spaced-apart from the main surface of the photoresist layer 15 by a distance ranging from about 3 mm to about 15 mm. In some embodiments, the surface of the showerhead 270 facing the photoresist layer 15 is spaced-apart from the main surface of the photoresist layer 15 by a distance ranging of about 6 mm.

Figure 5C:
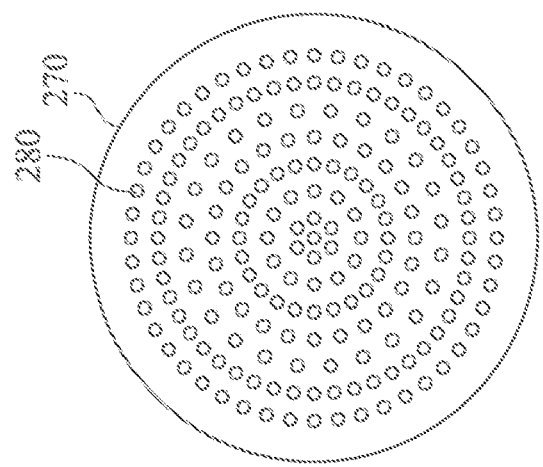
FIGS. 5A, 5B, and 5C show embodiments of gas showerheads according to embodiments of the disclosure.
Figure 5B:
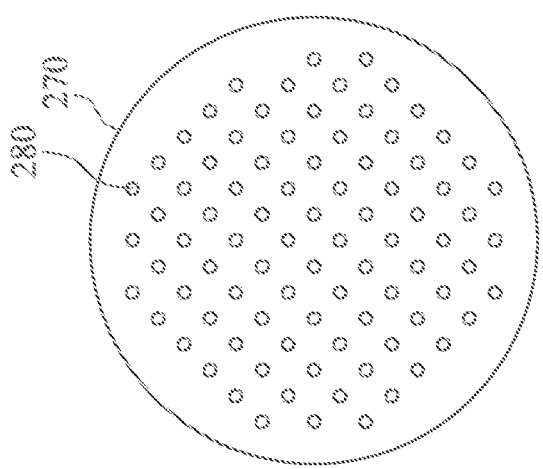
Figure 5A:
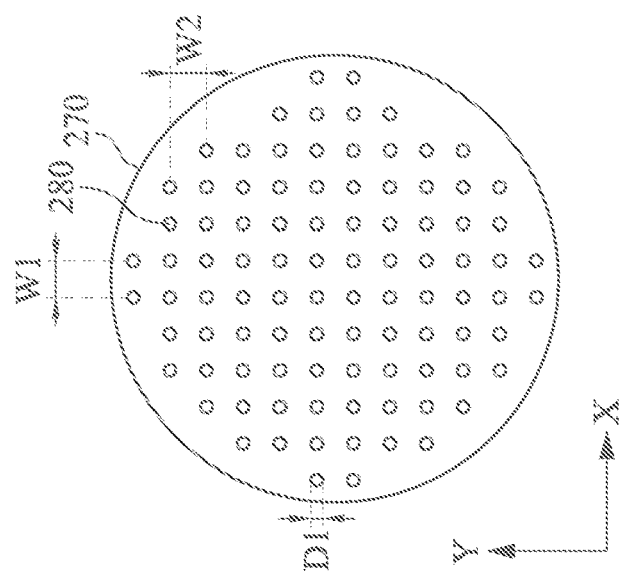

In some embodiments, the showerhead 270 includes a plurality of openings 280 through which the gas flows, as shown in FIGS. 5A-5C. As shown in FIG. 5A, in some embodiments, the plurality of openings are arranged in a row and column arrangement. In some embodiments, each of the plurality of openings 280 has a diameter D1 ranging from about 0.1 mm to about 10 mm. In some embodiments, each of the plurality of openings 280 has a diameter D1 ranging from about 1 mm to about 5 mm. In some embodiments, the diameter D1 of the plurality of openings 280 is about 2 mm. In some embodiments, the plurality of openings 280 have a pitch W1, W2 along the X-direction and the Y-direction ranging from about 0.5 mm to about 24 mm. In some embodiments, the plurality of openings 280 have a pitch ranging from about 3 mm to about 10 mm. In some embodiments, the plurality of openings 280 have a pitch of about 6 mm. In some embodiments, the pitch in the X direction and the pitch in the Y direction are about the same, in other embodiments, the pitch in the X direction and the Y direction are different. Openings having a pitch outside the ranges disclosed herein may result in photoresist patterns having decreased critical dimension uniformity and increased line width roughness.

In some embodiments, gas showerheads 270 having other patterns of openings 280 are included. As shown in FIG. 5B, in some embodiments, the plurality of openings 280 are arranged in lines, where openings 280 in alternating lines are staggered relative to immediately adjacent lines. In another embodiment, the openings 280 are arranged in concentric circles surrounding a central opening, as shown in FIG. 5C. In some embodiments, the diameter D1 of the openings 280 closer to the center of the gas showerhead 270 is larger than the diameter D1 of the openings 280 closer to the periphery of the gas showerhead 270. The patterns of openings 280 are not limited to the embodiments shown herein. In other embodiments, other patterns, such as a spiral pattern, random pattern, etc. are within the scope of this disclosure.

Figure 6:
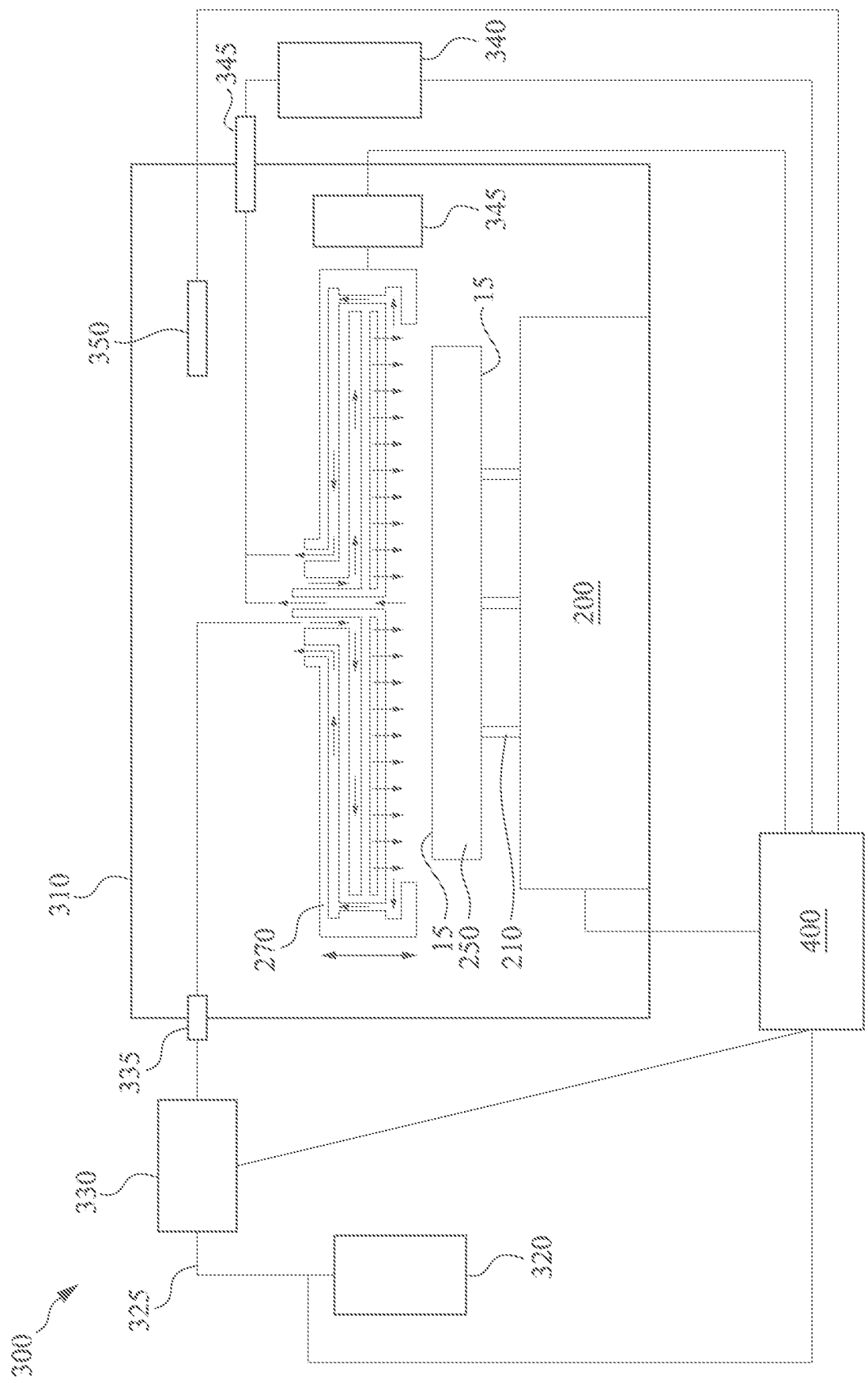
FIG. 6 shows a semiconductor device manufacturing tool according to embodiments of the disclosure.

A semiconductor device manufacturing tool 300 according to some embodiments of this disclosure is illustrated in FIG. 6. In some embodiments, the semiconductor device manufacturing tool 300 includes a processing chamber 310, such as a post-exposure baking chamber. A heating element 200 is disposed inside the chamber. A plurality of support pins 210 is disposed inside the chamber 310. The plurality of support pins 210 is configured to support a photoresist coated semiconductor substrate 250 over the heating element 200. The plurality of support pins 210 are configured to raise and lower the semiconductor substrate 250. A gas showerhead 270 is disposed over the heating element in some embodiments. In other embodiments, other types of gas manifolds are used, such as the gas manifold 220 illustrated in FIGS. 4A-4C and 13A-13C.

In some embodiments, the semiconductor device manufacturing tool 300 includes a gas source 320. The gas source 320 is connected to chamber 310 by gas distribution line 325. A humidifier/dehumidifier 330 is connected to the gas source 320 downstream from the gas source and upstream from the chamber 310. The humidity of the gas is regulated/adjusted prior to entry into the chamber 310 through a gas inlet 335 in some embodiments. In other embodiments, the gas source stores and dispenses gas at the desired relative humidity. The humid gas is subsequently introduced into the gas showerhead/manifold 270, and is then flowed over the surface of the photoresist coated substrate. In some embodiments, a vacuum pump 340 is connected to the chamber through a gas exhaust 345. The vacuum pump 340 is used to exhaust the humid gas after it flows over the photoresist coated substrate 250. In some embodiments, the vacuum pump is also used to evacuate the chamber 310 in some embodiments. In some embodiments, a humidity sensor 350 is included in the processing chamber 310 or in the showerhead 270 or gas manifold 220.

In some embodiments, a controller 400 is configured to control a flow rate or humidity of a gas supplied through the gas showerhead 270, a temperature of the heating element 200; and motion of the plurality of the support pins 210 along a vertical direction in some embodiments, as shown in FIG. 6. In an embodiment, the semiconductor device manufacturing tool includes a source of the gas supplied through the gas showerhead. In some embodiments, the controller 400 controls the flow rate of the humid gas, the humidifier/dehumidifier 330, the vacuum pump 340, and a mechanism 355 for raising and lowering the gas showerhead/manifold 270. In some embodiments, the controller 400 communicates with the humidity sensor 350, and determines whether to activate the humidifier/dehumidifier 330 to adjust the relative humidity of the gas.

Figure 7A:
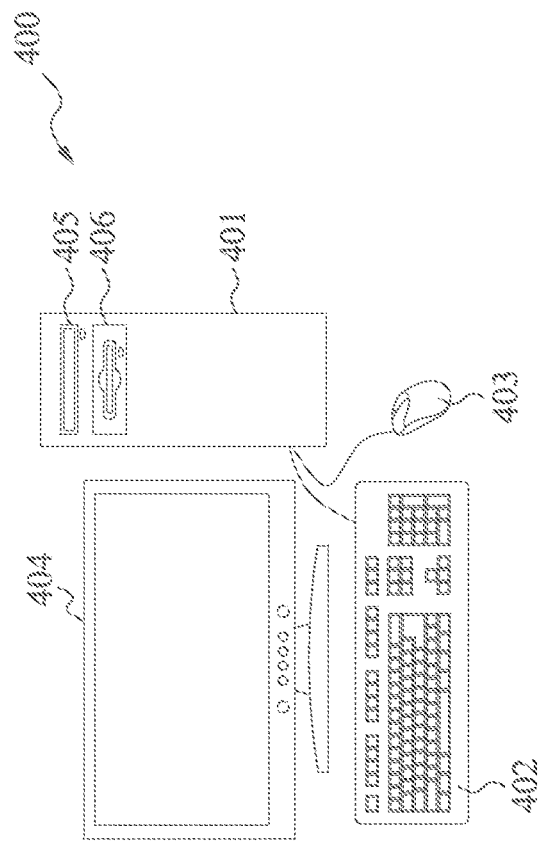
FIGS. 7A and 7B show an embodiment of a controller according to embodiments of the disclosure.

All of or a part of the methods or operations of the foregoing embodiments are realized using computer hardware and special purpose computer programs executed thereon. In FIG. 7A, an embodiment of the controller 400 is illustrated. The controller 400 is a computer system 400 provided with a computer 401 including an optical disk read only memory (e.g., CD-ROM or DVD-ROM) drive 405 and a magnetic disk drive 406, a keyboard 402, a mouse 403, and a monitor 404 in some embodiments.

Figure 7B:
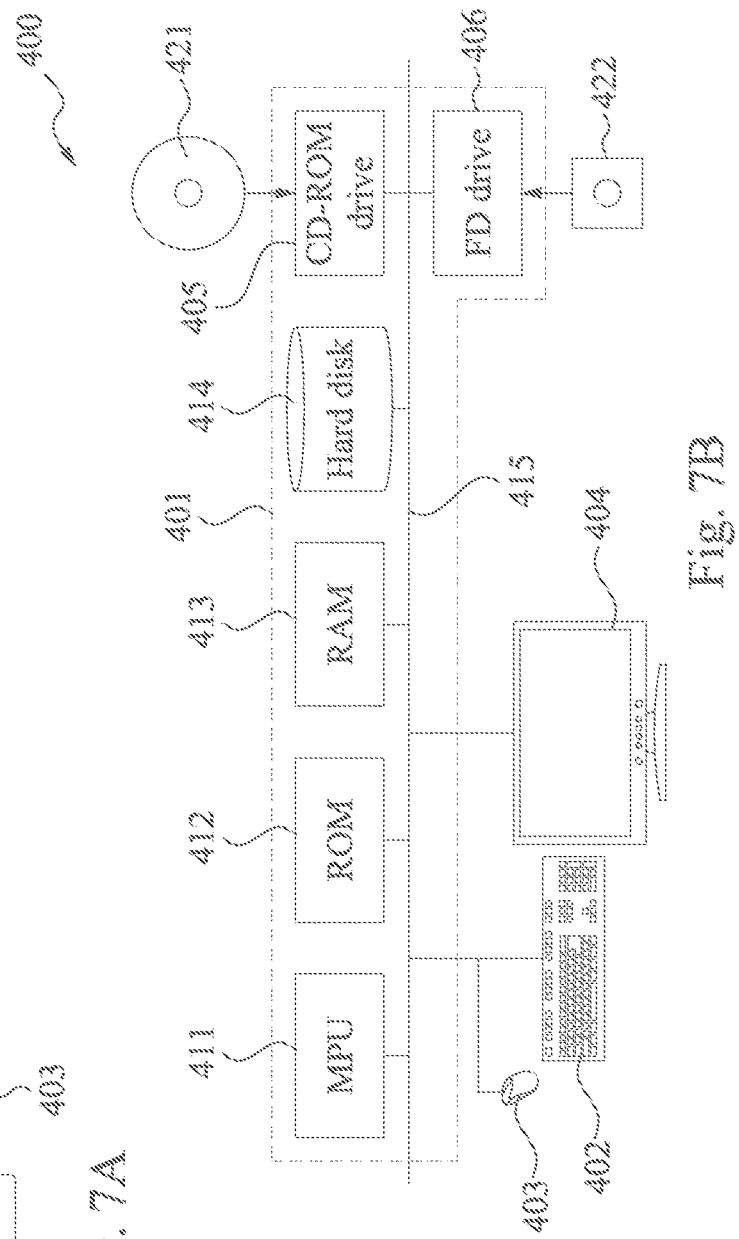

FIG. 7B is a diagram showing an internal configuration of the computer system 400 in some embodiments. In FIG. 7B, the computer 401 is provided with, in addition to the optical disk drive 405 and the magnetic disk drive 406, one or more processors 411, such as a micro-processor unit (MPU); a ROM 412 in which a program such as a boot up program is stored; a random access memory (RAM) 413 connected to the processors 411 and in which a command of an application program is temporarily stored and a temporary electronic storage area is provided; a hard disk 414 in which an application program, an operating system program, and data are stored; and a data communication bus 415 that connects the processors 411, the ROM 412, and the like. Note that the computer 401 may include a network card (not shown) for providing a connection to a computer network such as a local area network (LAN), wide area network (WAN) or any other useful computer network for communicating data used by the computing system 400.

The program for causing the computer system 400 to execute the process for controlling the apparatus of FIG. 6 and/or to execute the process for the method of manufacturing a semiconductor device according to the embodiments disclosed herein are stored in an optical disk 421 or a magnetic disk 422, which are inserted into the optical disk drive 405 or the magnetic disk drive 406, and transmitted to the hard disk 414. Alternatively, the program may be transmitted via a network (not shown) to the computer system 400 and stored in the hard disk 414. At the time of execution, the program is loaded into the RAM 413. The program may be loaded from the optical disk 421 or the magnetic disk 422, or directly from a network. The stored programs do not necessarily have to include, for example, an operating system (OS) or a third party program to cause the computer 401 to execute the methods disclosed herein. The program includes a command portion to call an appropriate function (module) in a controlled mode and obtain desired results in some embodiments.

Figure 9A:
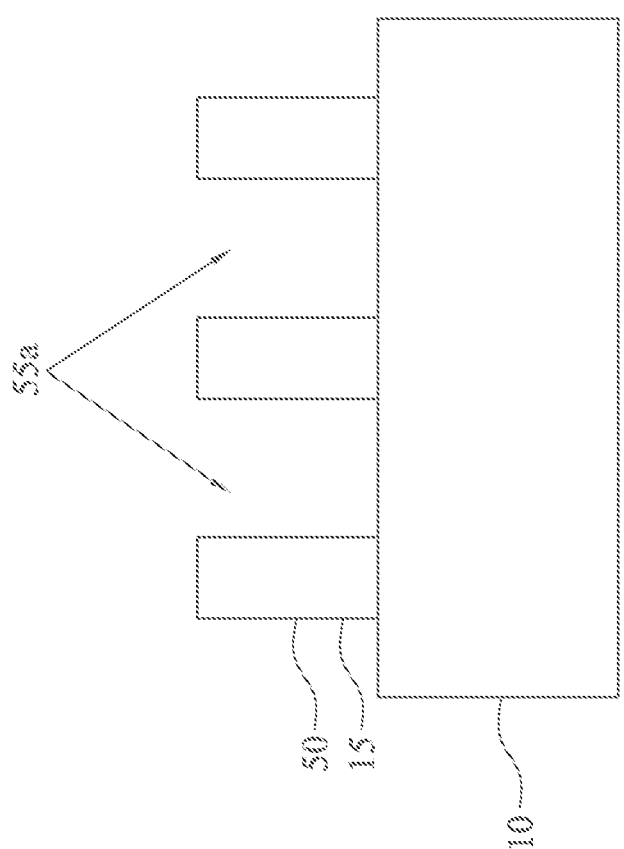
FIGS. 9A and 9B show process stages of a sequential operation according to embodiments of the disclosure.
Figure 9B:
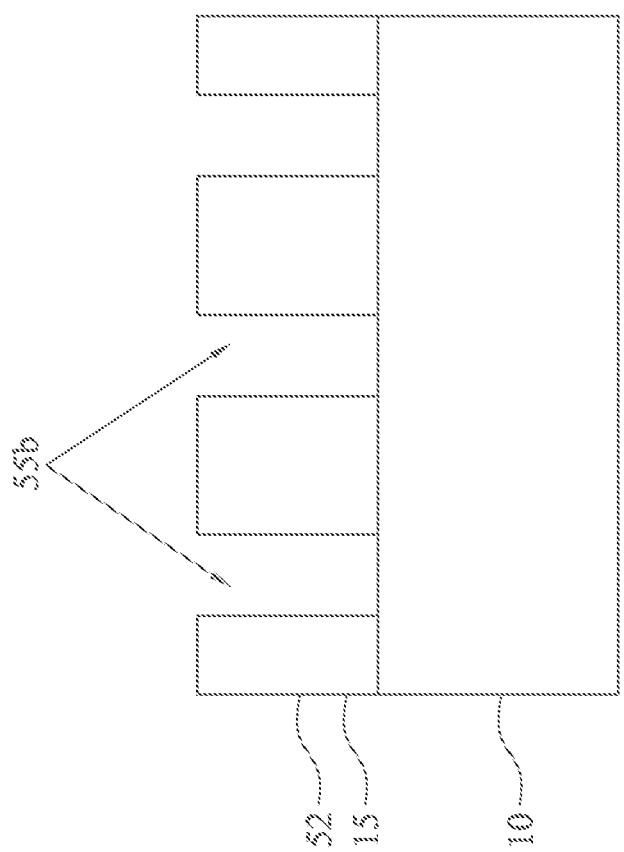

The selectively exposed photoresist layer is subsequently developed by applying a developer to the selectively exposed photoresist layer in operation S150. As shown in FIG. 8, a developer 57 is supplied from a dispenser 62 to the photoresist layer 15. In some embodiments, where the photoresist is a negative-tone resist, the unexposed portion of the photoresist layer 52 is removed by the developer 57 forming a pattern of openings 55a in the photoresist layer 15 to expose the substrate 10, as shown in FIG. 9A. In other embodiments, where the photoresist is a positive-tone resist, the exposed portion of the photoresist layer 50 is removed by the developer 57 forming a pattern of openings 55b in the photoresist layer 15 to expose the substrate 10, as shown in FIG. 9B.

Figure 10A:
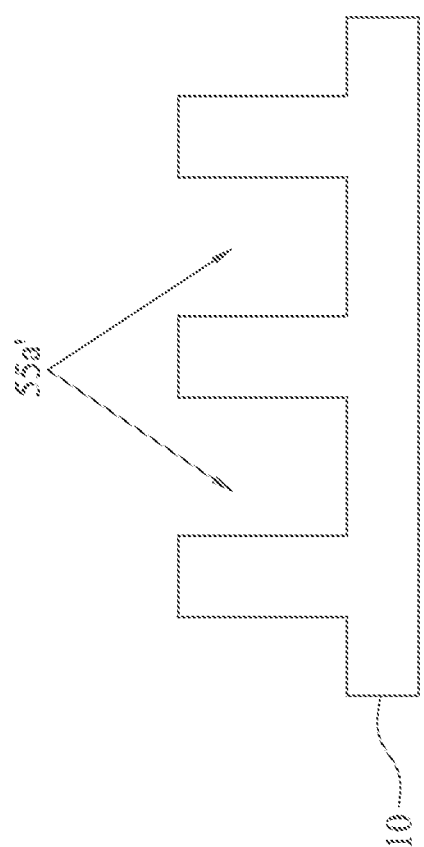

In some embodiments, the pattern of openings 55a, 55b in the photoresist layer 15 are extended into the layer to be patterned or substrate 10 to create a pattern of openings 55a', 55b' in the substrate 10, thereby transferring the pattern in the photoresist layer 15 into the substrate 10, as shown in FIGS. 10A and 10B. The pattern is extended into the substrate by etching, using one or more suitable etchants. The portion of the photoresist layer 15 remaining after the development operation is at least partially removed during the etching operation in some embodiments. In other embodiments, the remaining photoresist layer 15 is removed after etching the substrate 10 by using a suitable photoresist stripper solvent or by a photoresist ashing operation.

In some embodiments, the substrate 10 includes a single crystalline semiconductor layer on at least it surface portion. The substrate 10 may include a single crystalline semiconductor material such as, but not limited to Si, Ge, SiGe, GaAs, InSb, GaP, GaSb, InAlAs, InGaAs, GaSbP, GaAsSb and InP. In some embodiments, the substrate 10 is a silicon layer of an SOI (silicon-on insulator) substrate. In certain embodiments, the substrate 10 is made of crystalline Si.

The substrate 10 may include in its surface region, one or more buffer layers (not shown). The buffer layers can serve to gradually change the lattice constant from that of the substrate to that of subsequently formed source/drain regions. The buffer layers may be formed from epitaxially grown single crystalline semiconductor materials such as, but not limited to Si, Ge, GeSn, SiGe, GaAs, InSb, GaP, GaSb, InAlAs, InGaAs, GaSbP, GaAsSb, GaN, GaP, and InP. In an embodiment, the silicon germanium (SiGe) buffer layer is epitaxially grown on the silicon substrate 10. The germanium concentration of the SiGe buffer layers may increase from 30 atomic % for the bottom-most buffer layer to 70 atomic % for the top-most buffer layer.

In some embodiments, the substrate 10 includes one or more layers of at least one metal, metal alloy, and metal nitride/sulfide/oxide/silicide having the formula $MX_a$, where M is a metal and X is N, S, Se, O, Si, and a is from about 0.4 to about 2.5. In some embodiments, the substrate 10 includes titanium, aluminum, cobalt, ruthenium, titanium nitride, tungsten nitride, tantalum nitride, or combinations thereof.

In some embodiments, the substrate 10 includes a dielectric having at least a silicon or metal oxide or nitride of the formula $MX_b$, where M is a metal or Si, X is N or O, and b ranges from about 0.4 to about 2.5. In some embodiments, the substrate 10 includes silicon dioxide, silicon nitride, aluminum oxide, hafnium oxide, lanthanum oxide, or combinations thereof.

In some embodiments, the substrate 10 refers to any underlying layers over which a resist layer is formed. The substrate 10 is subsequently patterned using photolithographic and etching operations.

The photoresist layer 15 is a photosensitive layer that is patterned by exposure to actinic radiation. Typically, the chemical properties of the photoresist regions struck by incident radiation change in a manner that depends on the type of photoresist used. Photoresist layers 15 are either positive-tone resists or negative tone-resists. A positive-tone resist refers to a photoresist material that when exposed to radiation, such as UV light, becomes soluble in a developer, while the region of the photoresist that is non-exposed (or exposed less) is insoluble in the developer. A negative-tone resist, on the other hand, refers to a photoresist material that when exposed to radiation becomes insoluble in the developer, while the region of the photoresist that is non-exposed (or exposed less) is soluble in the developer. The region of a negative resist that becomes insoluble upon exposure to radiation may become insoluble due to a cross-linking reaction caused by the exposure to radiation.

Whether a resist is a positive-tone or negative-tone may depend on the type of developer used to develop the resist. For example, some positive tone photoresists provide a positive pattern, (i.e.—the exposed regions are removed by the developer), when the developer is an aqueous-based developer, such as a tetramethylammonium hydroxide (TMAH) solution. On the other hand, the same photoresist provides a negative pattern (i.e.—the unexposed regions are removed by the developer) when the developer is an organic solvent. Further, in some negative-tone photoresists developed with the TMAH solution, the unexposed regions of the photoresist are removed by the TMAH, and the exposed regions of the photoresist, that undergo cross-linking upon exposure to actinic radiation, remain on the substrate after development.

Resist compositions according to the present disclosure are metal-containing resists. The metal-containing resists of the present disclosure include metallic cores complexed with one or more ligands in a solvent. In some embodiments, the resist includes metal particles. In some embodiments, the metal particles are nanoparticles. As used herein, nanoparticles are particles having an average particle size between about 1 nm and about 20 nm. In some embodiments, the metallic cores, including from 1 to about 18 metal particles, are complexed with one or more organic ligands in a solvent. In some embodiments, the metallic cores include 3, 6, 9, or more metal nanoparticles complexed with one or more organic ligands in a solvent.

In some embodiments, the metal particle is one or more of titanium (Ti), zinc (Zn), zirconium (Zr), nickel (Ni), cobalt (Co), manganese (Mn), copper (Cu), iron (Fe), strontium (Sr), tungsten (W), vanadium (V), chromium (Cr), tin (Sn), hafnium (Hf), indium (In), cadmium (Cd), molybdenum (Mo), tantalum (Ta), niobium (Nb), aluminum (Al), cesium (Cs), barium (Ba), lanthanum (La), cerium (Ce), silver (Ag), antimony (Sb), combinations thereof, or oxides thereof. In some embodiments, the metal particles include one or more selected from the group consisting of Ce, Ba, La, Ce, In, Sn, Ag, Sb, and oxides thereof.

In some embodiments, the metal nanoparticles have an average particle size between about 2 nm and about 5 nm. In some embodiments, the amount of metal nanoparticles in the resist composition ranges from about 0.5 wt. % to about 15 wt. % based on the weight of the nanoparticles and the solvent. In some embodiments, the amount of nanoparticles in the resist composition ranges from about 5 wt. % to about 10 wt. % based on the weight of the nanoparticles and the solvent. In some embodiments, the concentration of the metal particles ranges from 1 wt. % to 7 wt. % based on the weight of the solvent and the metal particles. Below about 0.5 wt. % metal nanoparticles, the resist coating is too thin. Above about 15 wt. % metal nanoparticles, the resist coating is too thick and viscous.

In some embodiments, the metallic core is complexed by a ligand, wherein the ligand includes branched or unbranched, cyclic or non-cyclic, saturated organic groups, including C1-C7 alkyl groups or C1-C7 fluoroalkyl groups. The C1-C7 alkyl groups or C1-C7 fluoroalkyl groups include one or more substituents selected from the group consisting of —CF$_3$, —SH, —OH, =O, —S—, —P—, —PO$_2$, —C(=O) SH, —C(=O) OH, —C(=O)O—, —O—, —N—, —C(=O) NH, —SO$_2$OH, —SO$_2$SH, —SOH, and —SO$_2$—. In some embodiments, the ligand includes one or more substituents selected from the group consisting of —CF$_3$, —OH, —SH, and —C(=O) OH substituents.

In some embodiments, the ligand is a carboxylic acid or sulfonic acid ligand. For example, in some embodiments, the ligand is a methacrylic acid. In some embodiments, the metal particles are nanoparticles, and the metal nanoparticles are complexed with ligands including aliphatic or aromatic groups. The aliphatic or aromatic groups may be unbranched or branched with cyclic or noncyclic saturated pendant groups containing 1-9 carbons, including alkyl groups, alkenyl groups, and phenyl groups. The branched groups may be further substituted with oxygen or halogen. In some embodiments, the second ligand is a branched or unbranched, aliphatic or aromatic, substituted or unsubstituted carboxylic acid or sulfonic acid ligand, wherein when the second ligand is substituted, the substituent selected from one or more of a C1-C9 alkyl group, a C2-C9 alkenyl group, or a C6-C9 phenyl group.

In some embodiments, each metal particle is complexed by 1 to 25 ligand units. In some embodiments, each metal particle is complexed by 3 to 18 ligand units.

In some embodiments, the resist composition includes about 0.1 wt. % to about 20 wt. % of the ligands based on the total weight of the resist composition. In some embodiments, the resist includes about 1 wt. % to about 10 wt. % of the ligands. In some embodiments, the ligand concentration is about 10 wt. % to about 40 wt. % based on the weight of the metal particles and the weight of the ligands. Below about 10 wt. %, ligand, the organometallic photoresist does not function well. Above about 40 wt. %, ligand, it is difficult to form a consistent photoresist layer. In some embodiments, the ligand(s) is dissolved at about a 5 wt. % to about 10 wt. % weight range in a coating solvent, such as propylene glycol methyl ether acetate (PGMEA) based on the weight of the ligand(s) and the solvent.

The resist composition solvent can be any suitable solvent. In some embodiments, the solvent is one or more of propylene glycol methyl ether acetate (PGMEA), propylene glycol monomethyl ether (PGME), 1-ethoxy-2-propanol (PGEE), γ-butyrolactone (GBL), cyclohexanone (CHN), ethyl lactate (EL), methanol, ethanol, propanol, n-butanol, acetone, dimethylformamide (DMF), isopropanol (IPA), tetrahydrofuran (THF), methyl isobutyl carbinol (MIBC), n-butyl acetate (nBA), or 2-heptanone (MAK).

In some embodiments, the metallic core/ligand complexes are formed by mixing the metallic particles with the ligands. In some embodiments, the metallic core/ligand complexes are formed spontaneously upon mixing the metallic particles with the ligands. In other embodiments, the mixture of metallic particles and ligands are heated to a temperature of about 80° C. to about 150° C. for about 30 seconds to about 240 seconds to form the metallic core/ligand complexes.

In some embodiments, resist compositions according to embodiments of the disclosure, such as a photoresist include a polymer or a polymerizable monomer or oligomer along with one or more photoactive compounds (PACs). In some embodiments, the concentration of the polymer, monomer, or oligomer ranges from about 1 wt. % to about 75 wt. % based on the total weight of the resist composition. In other embodiments, the concentration of the polymer, monomer, or oligomer ranges from about 5 wt. % to about 50 wt. %. At concentrations of the polymer, monomer, or oligomer below the disclosed ranges the polymer, monomer, or oligomer has negligible effect on the resist performance. At concentrations above the disclosed range there is no substantial improvement in resist performance or there is degradation in the formation of consistent resist layers.

In some embodiments, the polymerizable monomer or oligomer includes an acrylic acid, an acrylate, a hydroxystyrene, or an alkylene. In some embodiments, the polymer includes a hydrocarbon structure (such as an alicyclic hydrocarbon structure) that contains one or more groups that will decompose (e.g., acid labile groups) or otherwise react when mixed with acids, bases, or free radicals generated by the PACs (as further described below). In some embodiments, the hydrocarbon structure includes a repeating unit that forms a skeletal backbone of the polymer resin. This repeating unit may include acrylic esters, methacrylic esters, crotonic esters, vinyl esters, maleic diesters, fumaric diesters, itaconic diesters, (meth)acrylonitrile, (meth)acrylamides, styrenes, vinyl ethers, combinations of these, or the like.

Specific structures that are utilized for the repeating unit of the hydrocarbon structure in some embodiments, include one or more of methyl acrylate, ethyl acrylate, n-propyl acrylate, isopropyl acrylate, n-butyl acrylate, isobutyl acrylate, tert-butyl acrylate, n-hexyl acrylate, 2-ethylhexyl acrylate, acetoxyethyl acrylate, phenyl acrylate, 2-hydroxyethyl acrylate, 2-methoxyethyl acrylate, 2-ethoxyethyl acrylate, 2-(2-methoxyethoxy)ethyl acrylate, cyclohexyl acrylate, benzyl acrylate, 2-alkyl-2-adamantyl(meth)acrylate or dialkyl(1-adamantyl)methyl (meth)acrylate, methyl methacrylate, ethyl methacrylate, n-propyl methacrylate, isopropyl methacrylate, n-butyl methacrylate, isobutyl methacrylate, tert-butyl methacrylate, n-hexyl methacrylate, 2-ethylhexyl methacrylate, acetoxyethyl methacrylate, phenyl methacrylate, 2-hydroxyethyl methacrylate, 2-methoxyethyl methacrylate, 2-ethoxyethyl methacrylate, 2-(2-methoxyethoxy)ethyl methacrylate, cyclohexyl methacrylate, benzyl methacrylate, 3-chloro-2-hydroxypropyl methacrylate, 3-acetoxy-2-hydroxypropyl methacrylate, 3-chloroacetoxy-2-hydroxypropyl methacrylate, butyl crotonate, hexyl crotonate, or the like. Examples of the vinyl esters include vinyl acetate, vinyl propionate, vinyl butylate, vinyl methoxyacetate, vinyl benzoate, dimethyl maleate, diethyl maleate, dibutyl maleate, dimethyl fumarate, diethyl fumarate, dibutyl fumarate, dimethyl itaconate, diethyl itaconate, dibutyl itaconate, acrylamide, methyl acrylamide, ethyl acrylamide, propyl acrylamide, n-butyl acrylamide, tert-butyl acrylamide, cyclohexyl acrylamide, 2-methoxyethyl acrylamide, dimethyl acrylamide, diethyl acrylamide, phenyl acrylamide, benzyl acrylamide, methacrylamide, methyl methacrylamide, ethyl methacrylamide, propyl methacrylamide, n-butyl methacrylamide, tert-butyl methacrylamide, cyclohexyl methacrylamide, 2-methoxyethyl methacrylamide, dimethyl methacrylamide, diethyl methacrylamide, phenyl methacrylamide, benzyl methacrylamide, methyl vinyl ether, butyl vinyl ether, hexyl vinyl ether, methoxyethyl vinyl ether, dimethylaminoethyl vinyl ether, or the like. Examples of styrenes include styrene, methyl styrene, dimethyl styrene, trimethyl styrene, ethyl styrene, isopropyl styrene, butyl styrene, methoxy styrene, butoxy styrene, acetoxy styrene, hydroxy styrene, chloro styrene, dichloro styrene, bromo styrene, vinyl methyl benzoate, α-methyl styrene, maleimide, vinylpyridine, vinylpyrrolidone, vinylcarbazole, combinations of these, or the like.

In some embodiments, the polymer is a polyhydroxystyrene, a polymethyl methacrylate, or a polyhydroxystyrene-t-butyl acrylate, e.g.—

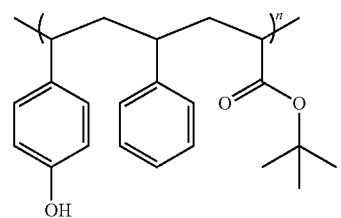

In some embodiments, the repeating unit of the hydrocarbon structure also has either a monocyclic or a polycyclic hydrocarbon structure substituted into it, or the monocyclic or polycyclic hydrocarbon structure is the repeating unit, in order to form an alicyclic hydrocarbon structure. Specific examples of monocyclic structures in some embodiments include bicycloalkane, tricycloalkane, tetracycloalkane, cyclopentane, cyclohexane, or the like. Specific examples of polycyclic structures in some embodiments include adamantane, norbornane, isobornane, tricyclodecane, tetracyclododecane, or the like.

The group which will decompose, otherwise known as a leaving group or, in some embodiments in which the PAC is a photoacid generator, an acid labile group, is attached to the hydrocarbon structure so that, it will react with the acids/bases/free radicals generated by the PACs during exposure. In some embodiments, the group which will decompose is a carboxylic acid group, a fluorinated alcohol group, a phenolic alcohol group, a sulfonic group, a sulfonamide group, a sulfonylimido group, an (alkylsulfonyl) (alkylcarbonyl) methylene group, an (alkylsulfonyl) (alkyl-carbonyl)imido group, a bis(alkylcarbonyl)methylene group, a bis(alkylcarbonyl)imido group, a bis(alkylsylfonyl)methylene group, a bis(alkylsulfonyl)imido group, a tris(alkylcarbonyl)methylene group, a tris(alkylsulfonyl)methylene group, combinations of these, or the like. Specific groups that are used for the fluorinated alcohol group include fluorinated hydroxyalkyl groups, such as a hexafluoroisopropanol group in some embodiments. Specific groups that are used for the carboxylic acid group include acrylic acid groups, methacrylic acid groups, or the like.

In some embodiments, the polymer also includes other groups attached to the hydrocarbon structure that help to improve a variety of properties of the polymerizable resin. For example, inclusion of a lactone group to the hydrocarbon structure assists to reduce the amount of line edge roughness after the photoresist has been developed, thereby helping to reduce the number of defects that occur during development. In some embodiments, the lactone groups include rings having five to seven members, although any suitable lactone structure may alternatively be used for the lactone group.

In some embodiments, the polymer includes groups that can assist in increasing the adhesiveness of the photoresist layer 15 to underlying structures (e.g., substrate 10). Polar groups may be used to help increase the adhesiveness. Suitable polar groups include hydroxyl groups, cyano groups, or the like, although any suitable polar group may, alternatively, be used.

Optionally, the polymer includes one or more alicyclic hydrocarbon structures that do not also contain a group, which will decompose in some embodiments. In some embodiments, the hydrocarbon structure that does not contain a group which will decompose includes structures such as 1-adamantyl(meth)acrylate, tricyclodecanyl (meth)acrylate, cyclohexyl (meth)acrylate, combinations of these, or the like.

Some embodiments of the photoresist include one or more photoactive compounds (PACs). The PACs are photoactive components, such as photoacid generators (PAG), photobase (PBG) generators, photo decomposable bases (PDB), free-radical generators, or the like. The PACs may be positive-acting or negative-acting. In some embodiments in which the PACs are a photoacid generator, the PACs include halogenated triazines, onium salts, diazonium salts, aromatic diazonium salts, phosphonium salts, sulfonium salts, iodonium salts, imide sulfonate, oxime sulfonate, diazodisulfone, disulfone, o-nitrobenzylsulfonate, sulfonated esters, halogenated sulfonyloxy dicarboximides, diazodisulfones, α-cyanooxyamine-sulfonates, imidesulfonates, ketodiazosulfones, sulfonyldiazoesters, 1,2-di(arylsulfonyl) hydrazines, nitrobenzyl esters, and the s-triazine derivatives, combinations of these, or the like.

Specific examples of photoacid generators include α-(trifluoromethylsulfonyloxy)-bicyclo[2.2.1]hept-5-ene-2,3-dicarb-o-ximide (MDT), N-hydroxy-naphthalimide (DDSN), benzoin tosylate, t-butylphenyl-α-(p-toluenesulfonyloxy)-acetate and t-butyl-α-(p-toluenesulfonyloxy)-acetate, triarylsulfonium and diaryliodonium hexafluoroantimonates, hexafluoroarsenates, trifluoromethanesulfonates, iodonium perfluorooctanesulfonate, N-camphorsulfonyloxynaphthalimide, N-pentafluorophenylsulfonyloxynaphthalimide, ionic iodonium sulfonates such as diaryl iodonium (alkyl or aryl) sulfonate and bis-(di-t-butylphenyl) iodonium camphanylsulfonate, perfluoroalkanesulfonates such as perfluoropentanesulfonate, perfluorooctanesulfonate, perfluoromethanesulfonate, aryl (e.g., phenyl or benzyl)triflates such as triphenylsulfonium triflate or bis-(t-butylphenyl) iodonium triflate; pyrogallol derivatives (e.g., trimesylate of pyrogallol), trifluoromethanesulfonate esters of hydroxyimides, α,α'-bis-sulfonyl-diazomethanes, sulfonate esters of nitro-substituted benzyl alcohols, naphthoquinone-4-diazides, alkyl disulfones, or the like.

In some embodiments in which the PACs are free-radical generators, the PACs include n-phenylglycine; aromatic ketones, including benzophenone, N,N'-tetramethyl-4,4'-diaminobenzophenone, N,N'-tetraethyl-4,4'-diaminobenzophenone, 4-methoxy-4'-dimethylaminobenzo-phenone, 3,3'-dimethyl-4-methoxybenzophenone, p,p'-bis(dimethylamino)benzo-phenone, p,p'-bis(diethylamino)-benzophenone; anthraquinone, 2-ethylanthraquinone; naphthaquinone; and phenanthraquinone; benzoins including benzoin, benzoinmethylether, benzoinisopropylether, benzoin-n-butylether, benzoin-phenylether, methylbenzoin and ethylbenzoin; benzyl derivatives, including dibenzyl, benzyldiphenyldisulfide, and benzyldimethylketal; acridine derivatives, including 9-phenylacridine, and 1,7-bis(9-acridinyl) heptane; thioxanthones, including 2-chlorothioxanthone, 2-methylthioxanthone, 2,4-diethylthioxanthone, 2,4-dimethylthioxanthone, and 2-isopropylthioxanthone; acetophenones, including 1,1-dichloroacetophenone, p-t-butyldichloro-acetophenone, 2,2-diethoxyacetophenone, 2,2-dimethoxy-2-phenylacetophenone, and 2,2-dichloro-4-phenoxyacetophenone; 2,4,5-triarylimidazole dimers, including 2-(o-chlorophenyl)-4,5-diphenylimidazole dimer, 2-(o-chlorophenyl)-4,5-di-(m-methoxyphenyl imidazole dimer, 2-(o-fluorophenyl)-4,5-diphenylimidazole dimer, 2-(o-methoxyphenyl)-4,5-diphenylimidazole dimer, 2-(p-methoxyphenyl)-4,5-diphenylimidazole dimer, 2,4-di(p-methoxyphenyl)-5-phenylimidazole dimer, 2-(2,4-dimethoxyphenyl)-4,5-diphenylimidazole dimer and 2-(p-methylmercaptophenyl)-4,5-diphenylimidazole dimmer; combinations of these, or the like.

In some embodiments, the PAC includes a quencher. In some embodiments, the quenchers include photobase generators and photo decomposable bases. In embodiments in which the PACs are photobase generators (PBG), the PBGs include quaternary ammonium dithiocarbamates, a aminoketones, oxime-urethane containing molecules such as dibenzophenoneoxime hexamethylene diurethan, ammonium tetraorganylborate salts, and N-(2-nitrobenzyloxycarbonyl) cyclic amines, combinations of these, or the like.

In some embodiments in which the PACs are photo decomposable bases (PBD), the PBDs include triphenylsulfonium hydroxide, triphenylsulfonium antimony hexafluoride, or triphenylsulfonium trifyl.

In some embodiments, the concentration of the photoactive compound ranges from about 0.1 wt. % to about 20 wt. % based on the total weight of the resist composition. In other embodiments, the concentration of the photoactive compound ranges from about 1 wt. % to about 15 wt. %. At concentrations of the photoactive compound below the disclosed ranges, the photoactive compound has negligible effect on the resist performance. At concentrations above the disclosed range, there is no substantial improvement in resist performance.

As one of ordinary skill in the art will recognize, the chemical compounds listed herein are merely intended as illustrated examples of the PACs and are not intended to limit the embodiments to only those PACs specifically described. Rather, any suitable PAC may be used, and all such PACs are fully intended to be included within the scope of the present embodiments.

In some embodiments, a cross-linking agent is added to the photoresist. The cross-linking agent reacts with one group from one of the hydrocarbon structures in the polymer and also reacts with a second group from a separate one of the hydrocarbon structures in order to cross-link and bond the two hydrocarbon structures together. This bonding and cross-linking increases the molecular weight of the polymer products of the cross-linking reaction and increases the overall linking density of the photoresist. Such an increase in density and linking density helps to improve the resist pattern.

In some embodiments the cross-linking agent has the following structure:

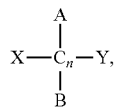

wherein C is carbon, n ranges from 1 to 15; A and B independently include a hydrogen atom, a hydroxyl group, a halide, an aromatic carbon ring, or a straight or cyclic alkyl, alkoxyl/fluoro, alkyl/fluoroalkoxyl chain having a carbon number of between 1 and 12, and each carbon C contains A and B; a first terminal carbon C at a first end of a carbon C chain includes X and a second terminal carbon C at a second end of the carbon chain includes Y, wherein X and Y independently include an amine group, a thiol group, a hydroxyl group, an isopropyl alcohol group, or an isopropyl amine group, except when n=1 then X and Y are bonded to the same carbon C. Specific examples of materials that may be used as the cross-linking agent include the following:

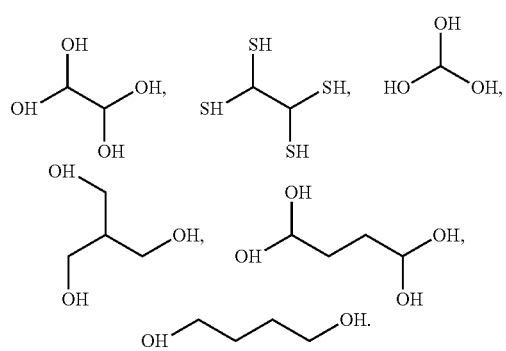

Alternatively, instead of or in addition to the cross-linking agent being added to the photoresist composition, a coupling reagent is added in some embodiments, in which the coupling reagent is added in addition to the cross-linking agent. The coupling reagent assists the cross-linking reaction by reacting with the groups on the hydrocarbon structure in the polymer resin before the cross-linking reagent, allowing for a reduction in the reaction energy of the cross-linking reaction and an increase in the rate of reaction. The bonded coupling reagent then reacts with the cross-linking agent, thereby coupling the cross-linking agent to the polymer resin.

Alternatively, in some embodiments in which the coupling reagent is added to the photoresist without the cross-linking agent, the coupling reagent is used to couple one group from one of the hydrocarbon structures in the polymer resin to a second group from a separate one of the hydrocarbon structures in order to cross-link and bond the two polymers together. However, in such an embodiment the coupling reagent, unlike the cross-linking agent, does not remain as part of the polymer, and only assists in bonding one hydrocarbon structure directly to another hydrocarbon structure.

In some embodiments, the coupling reagent has the following structure:

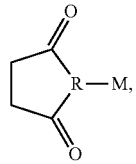

where R is a carbon atom, a nitrogen atom, a sulfur atom, or an oxygen atom; M includes a chlorine atom, a bromine atom, an iodine atom, $-NO_2$; $-SO_3-$; $-H-$; $-CN$; $-NCO$, $-OCN$; $-CO_2-$; $-OH$; $-OR^*$, $-OC(O)CR^*$; $-SR$, $-SO_2N(R^*)_2$; $-SO_2R^*$; $SOR$; $-OC(O)R^*$; $-C(O)OR^*$; $-C(O)R^*$; $-Si(OR^*)_3$; $-Si(R^*)_3$; epoxy groups, or the like; and $R^*$ is a substituted or unsubstituted C1-C12 alkyl, C1-C12 aryl, C1-C12 aralkyl, or the like. Specific examples of materials used as the coupling reagent in some embodiments include the following:

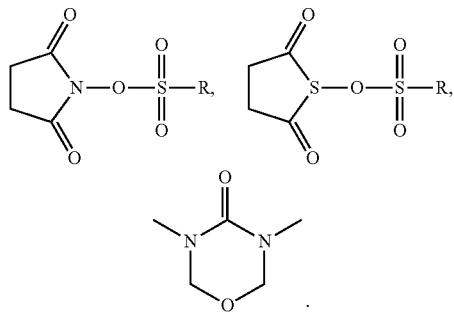

Other additives to the photoresist composition, in some embodiments, include a quencher for neutralizing excessive acid formed by photoacid generators. Another additive in some embodiments is a stabilizer, which assists in preventing undesired diffusion of the acids generated during exposure of the photoresist. In some embodiments, the stabilizer includes nitrogenous compounds, including aliphatic primary, secondary, and tertiary amines; cyclic amines, including piperidines, pyrrolidines, morpholines; aromatic heterocycles, including pyridines, pyrimidines, purines; imines, including diazabicycloundecene, guanidines, imides, amides, or the like. Alternatively, ammonium salts are also be used for the stabilizer in some embodiments, including ammonium, primary, secondary, tertiary, and quaternary alkyl- and aryl-ammonium salts of alkoxides, including hydroxide, phenolates, carboxylates, aryl and alkyl sulfonates, sulfonamides, or the like. Other cationic nitrogenous compounds, including pyridinium salts and salts of other heterocyclic nitrogenous compounds with anions, such as alkoxides, including hydroxide, phenolates, carboxylates, aryl and alkyl sulfonates, sulfonamides, or the like, are used in some embodiments.

Another additive in some embodiments of the photoresist is a dissolution inhibitor to help control dissolution of the photoresist during development. In an embodiment bile-salt esters may be utilized as the dissolution inhibitor. Specific examples of dissolution inhibitors in some embodiments include cholic acid, deoxycholic acid, lithocholic acid, t-butyl deoxycholate, t-butyl lithocholate, and t-butyl-3-acetyl lithocholate.

Another additive in some embodiments of the photoresist is a plasticizer. Plasticizers may be used to reduce delamination and cracking between the photoresist and underlying layers (e.g., the layer to be patterned). Plasticizers include monomeric, oligomeric, and polymeric plasticizers, such as oligo- and polyethyleneglycol ethers, cycloaliphatic esters, and non-acid reactive steroidaly-derived materials. Specific examples of materials used for the plasticizer in some embodiments include dioctyl phthalate, didodecyl phthalate, triethylene glycol dicaprylate, dimethyl glycol phthalate, tricresyl phosphate, dioctyl adipate, dibutyl sebacate, triacetyl glycerine, or the like.

A coloring agent is another additive included in some embodiments of the photoresist. The coloring agent observers examine the photoresist and find any defects that may need to be remedied prior to further processing. In some embodiments, the coloring agent is a triarylmethane dye or a fine particle organic pigment. Specific examples of materials in some embodiments include crystal violet, methyl violet, ethyl violet, oil blue #603, Victoria Pure Blue BOH, malachite green, diamond green, phthalocyanine pigments, azo pigments, carbon black, titanium oxide, brilliant green dye (C. I. 42020), Victoria Pure Blue FGA (Linebrow), Victoria BO (Linebrow) (C. I. 42595), Victoria Blue BO (C. I. 44045), Rhodamine 6G (C. I. 45160), benzophenone compounds, such as 2,4-dihydroxybenzophenone and 2,2',4,4'-tetrahydroxybenzophenone; salicylic acid compounds, such as phenyl salicylate and 4-t-butylphenyl salicylate; phenylacrylate compounds, such as ethyl-2-cyano-3,3-diphenylacrylate, and 2'-ethylhexyl-2-cyano-3,3-diphenylacrylate; benzotriazole compounds, such as 2-(2-hydroxy-5-methylphenyl)-2H-benzotriazole, and 2-(3-t-butyl-2-hydroxy-5-methylphenyl)-5-chloro-2H-benzotriazole; coumarin compounds, such as 4-methyl-7-diethylamino-1-benzopyran-2-one; thioxanthone compounds, such as diethylthioxanthone; stilbene compounds, naphthalic acid compounds, azo dyes, phthalocyanine blue, phthalocyanine green, iodine green, Victoria blue, crystal violet, titanium oxide, naphthalene black, Photopia methyl violet, bromphenol blue and bromcresol green; laser dyes, such as Rhodamine G6, Coumarin 500, DCM (4-(dicyanomethylene)-2-methyl-6-(4-dimethylaminostyryl)-4H pyran), Kiton Red 620, Pyrromethene 580, or the like. Additionally, one or more coloring agents may be used in combination to provide the desired coloring.

Adhesion additives are added to some embodiments of the photoresist to promote adhesion between the photoresist and an underlying layer upon which the photoresist has been applied (e.g., the layer to be patterned). In some embodiments, the adhesion additives include a silane compound with at least one reactive substituent such as a carboxyl group, a methacryloyl group, an isocyanate group and/or an epoxy group. Specific examples of the adhesion components include trimethoxysilyl benzoic acid, γ-methacryloxypropyl trimethoxy silane, vinyltriacetoxysilane, vinyltrimethoxysilane, γ-isocyanatepropyl triethoxy silane, γ-glycidoxypropyl trimethoxy silane, β-(3,4-epoxycyclohexyl)ethyl trimethoxy silane, benzimidazoles and polybenzimidazoles, a lower hydroxyalkyl substituted pyridine derivative, a nitrogen heterocyclic compound, urea, thiourea, an organophosphorus compound, 8-oxyquinoline, 4-hydroxypteridine and derivatives, 1,10-phenanthroline and derivatives, 2,2'-bipyridine and derivatives, benzotriazoles, organophosphorus compounds, phenylenediamine compounds, 2-amino-1-phenylethanol, N-phenylethanolamine, N-ethyldiethanolamine, N-ethylethanolamine and derivatives, benzothiazole, and a benzothiazoleamine salt having a cyclohexyl ring and a morpholine ring, 3-glycidoxypropyltrimethoxysilane, 3-glycidoxypropyltriethoxysilane, 3-mercaptopropyltrimethoxysilane, 3-mercaptopropyltriethoxysilane, 3-methacryloyloxypropyltrimethoxysilane, vinyl trimethoxysilane, combinations thereof, or the like.

Surface leveling agents are added to some embodiments of the photoresist to assist a top surface of the photoresist to be level, so that impinging light will not be adversely modified by an unlevel surface. In some embodiments, surface leveling agents include fluoroaliphatic esters, hydroxyl terminated fluorinated polyethers, fluorinated ethylene glycol polymers, silicones, acrylic polymer leveling agents, combinations thereof, or the like.

In some embodiments, the polymer, monomer, or oligomer, and the PACs, along with any desired additives or other agents, are added to the solvent for application. Once added, the mixture is then mixed in order to achieve a homogenous composition throughout the photoresist to ensure that there are no defects caused by uneven mixing or nonhomogenous composition of the photoresist. Once mixed together, the photoresist may either be stored prior to its usage or used immediately.

Once ready, the photoresist is applied onto the layer to be patterned, as shown in FIG. 2, such as the substrate 10 to form a photoresist layer 15. In some embodiments, the photoresist is applied using a process such as a spin-on coating process, a dip coating method, an air-knife coating method, a curtain coating method, a wire-bar coating method, a gravure coating method, a lamination method, an extrusion coating method, combinations of these, or the like. In some embodiments, the photoresist layer 15 thickness ranges from about 10 nm to about 300 nm.

After the photoresist layer 15 has been applied to the substrate 10, a pre-bake of the photoresist layer is performed in some embodiments to cure and dry the photoresist prior to radiation exposure (see FIG. 1). The curing and drying of the photoresist layer 15 removes solvent while leaving behind the organometallic, and the optional polymer, monomer, oligomer, photoactive compound, and the other chosen additives. In some embodiments, the pre-baking is performed at a temperature suitable to evaporate the solvent, such as between about 40° C. and 120° C., although the precise temperature depends upon the materials chosen for the photoresist. The pre-baking is performed for a time sufficient to cure and dry the photoresist layer, such as between about 10 seconds to about 10 minutes.

FIGS. 3A and 3B illustrate selective exposures of the photoresist layer to form an exposed region 50 and an unexposed region 52. In some embodiments, the exposure to radiation is carried out by placing the photoresist coated substrate in a photolithography tool. The photolithography tool includes a photomask 30/65, optics, an exposure radiation source to provide the radiation 45/97 for exposure, and a movable stage for supporting and moving the substrate under the exposure radiation.

In some embodiments, the radiation source (not shown) supplies radiation 45/97, such as ultraviolet light, to the photoresist layer 15, and the radiation is absorbed by the metal particles or the photoactive compound in order to induce a reaction in the photoresist layer to chemically alter those regions of the photoresist layer to which the radiation 45/97 impinges. In some embodiments, the radiation is electromagnetic radiation, such as g-line (wavelength of about 436 nm), i-line (wavelength of about 365 nm), ultraviolet radiation, far ultraviolet radiation, extreme ultraviolet, electron beams, or the like. In some embodiments, the radiation source is selected from the group consisting of a mercury vapor lamp, xenon lamp, carbon arc lamp, a KrF excimer laser light (wavelength of 248 nm), an ArF excimer laser light (wavelength of 193 nm), an $F_2$ excimer laser light (wavelength of 157 nm), or a $CO_2$ laser-excited Sn plasma (extreme ultraviolet, wavelength of 13.5 nm).

In some embodiments, optics (not shown) are used in the photolithography tool to expand, reflect, or otherwise control the radiation before or after the radiation 45/97 is patterned by the photomask 30/65. In some embodiments, the optics include one or more lenses, mirrors, filters, and combinations thereof to control the radiation 45/97 along its path.

In some embodiments, the exposure of the photoresist layer 15 uses an immersion lithography technique. In such a technique, an immersion medium (not shown) is placed between the final optics and the photoresist layer, and the exposure radiation 45 passes through the immersion medium.

After the photoresist layer 15 has been exposed to the exposure radiation 45, a post-exposure baking is performed in some embodiments to further the reaction initiated during the selective exposure to actinic radiation. In some embodiments including a photoactive compound, the post-exposure baking assists in the generating, dispersing, and reacting of the acid/base/free radical generated from the impingement of the radiation 45 upon the PACs during the exposure. Such thermal assistance helps to create or enhance chemical reactions, which generate chemical differences between the exposed region 50 and the unexposed region 52 within the photoresist layer 15. These chemical differences also cause differences in the solubility between the exposed region 50 and the unexposed region 52. In some embodiments, the post-exposure baking occurs at temperatures ranging from about 70° C. to about 160° C. for a period of between about 20 seconds and about 120 seconds.

In some embodiments, the photoresist developer 57 includes a solvent, and an acid or a base. In some embodiments, the concentration of the solvent is from about 60 wt. % to about 99 wt. % based on the total weight of the photoresist developer. The acid or base concentration is from about 0.001 wt. % to about 20 wt. % based on the total weight of the photoresist developer. In certain embodiments, the acid or base concentration in the developer is from about 0.01 wt. % to about 15 wt. % based on the total weight of the photoresist developer.

In some embodiments, the developer includes an solvent selected from the group consisting of propylene glycol methyl ether acetate (PGMEA), propylene glycol monomethyl ether (PGME), 1-ethoxy-2-propanol (PGEE), γ-butyrolactone (GBL), cyclohexanone (CHN), ethyl lactate (EL), methanol, ethanol, propanol, n-butanol, acetone, dimethylformamide (DMF), isopropanol (IPA), tetrahydrofuran (THF), methyl isobutyl carbinol (MIBC), n-butyl acetate (nBA), 2-heptanone (MAK), and isobutyl propionate. In other embodiments, the developer is an aqueous solvent, including a tetramethylammonium hydroxide (TMAH) solution.

In some embodiments, the developer 57 is applied to the photoresist layer 15 using a spin-on process. In the spin-on process, the developer 57 is applied to the photoresist layer 15 from above the photoresist layer 15 while the photoresist coated substrate is rotated, as shown in FIG. 8. In some embodiments, the developer 57 is supplied at a rate of between about 5 ml/min and about 800 ml/min, while the photoresist coated substrate 10 is rotated at a speed of between about 100 rpm and about 2000 rpm. In some embodiments, the developer is at a temperature of between about 10° C. and about 80° C. The development operation continues for between about 30 seconds to about 10 minutes in some embodiments.

While the spin-on operation is one suitable method for developing the photoresist layer 15 after exposure, it is intended to be illustrative and is not intended to limit the embodiment. Rather, any suitable development operations, including dip processes, puddle processes, and spray-on methods, may alternatively be used. All such development operations are included within the scope of the embodiments.

During the development process, the developer 57 dissolves the radiation-unexposed regions 52 of negative-tone resists to form a pattern 55a, exposing the surface of the substrate 10, as shown in FIG. 9A, leaving behind well-defined exposed photoresist regions 50, having improved definition than provided by conventional negative photoresist photolithography. In other embodiments, the developer 57 dissolves the radiation-exposed regions 50 of positive-tone resists to form a pattern 55b, exposing the surface of the substrate 10, as shown in FIG. 9B, leaving behind well-defined unexposed photoresist regions 52, having improved definition than provided by conventional positive photoresist photolithography.

After the developing operation S150, remaining developer is removed from the patterned photoresist covered substrate. The remaining developer is removed using a spin-dry process in some embodiments, although any suitable removal technique may be used. After the photoresist layer 15 is developed, and the remaining developer is removed, additional processing is performed while the patterned photoresist layer (exposed region 50, unexposed region 52) is in place. For example, an etching operation, using dry or wet etching, is performed in some embodiments, to transfer the pattern 55a, 55b of the photoresist layer to the underlying substrate 10, forming recesses 55a', 55b' as shown in FIGS. 10A and 10B. The substrate 10 has a different etch resistance than the photoresist layer 15. In some embodiments, the etchant is more selective to the substrate 10 than the photoresist layer 15.

In some embodiments, the substrate 10 and the photoresist layer 15 contain at least one etching resistance molecule. In some embodiments, the etching resistant molecule includes a molecule having a low Onishi number structure, a double bond, a triple bond, silicon, silicon nitride, titanium, titanium nitride, aluminum, aluminum oxide, silicon oxynitride, combinations thereof, or the like.

Figure 11:
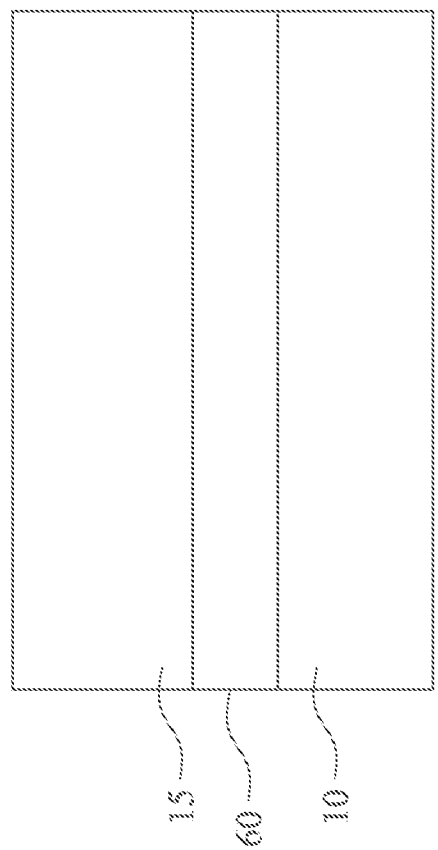
FIG. 11 shows a process stage of a sequential operation according to an embodiment of the disclosure.

In some embodiments, a layer to be patterned 60 is disposed over the substrate prior to forming the photoresist layer, as shown in FIG. 11. In some embodiments, the layer to be patterned 60 is a metallization layer or a dielectric layer, such as a passivation layer, disposed over a metallization layer. In embodiments where the layer to be patterned 60 is a metallization layer, the layer to be patterned 60 is formed of a conductive material using metallization processes, and metal deposition techniques, including chemical vapor deposition, atomic layer deposition, and physical vapor deposition (sputtering). Likewise, if the layer to be patterned 60 is a dielectric layer, the layer to be patterned 60 is formed by dielectric layer formation techniques, including thermal oxidation, chemical vapor deposition, atomic layer deposition, and physical vapor deposition.

Figure 12B:
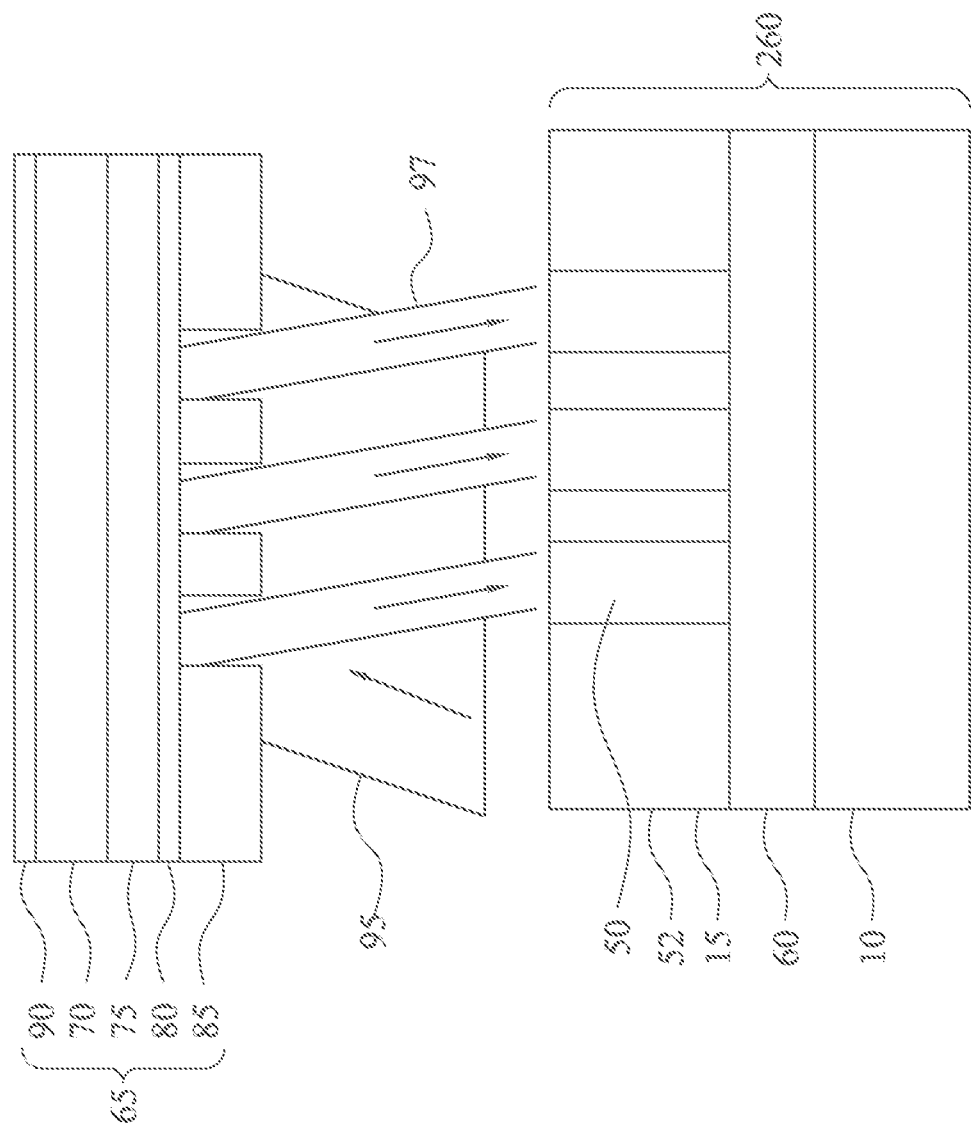

The photoresist layer 15 is subsequently selectively exposed to actinic radiation 45/97 to form exposed regions 50 and unexposed regions 52 in the photoresist layer, as shown in FIGS. 12A and 12B, and described herein in relation to FIGS. 3A and 3B.

The exposed photoresist coated substrate 260 is subsequently heated and exposed to a humid ambient as described in relation to FIGS. 4A, 4B, 4C, and 4D as shown in FIGS. 13A, 13B, 13C, and 13D.

As shown in FIG. 14, the photoresist layer 15 is developed by dispensing developer 57 from a dispenser 62 to form a pattern of photoresist openings 55a, 55b, as shown in FIGS. 15A and 15B. The development operation is similar to that explained with reference to FIGS. 8-9B, herein. In some embodiments, where the photoresist is a negative-tone resist, the unexposed portion of the photoresist layer 52 is removed by the developer 57 forming a pattern of openings 55a in the photoresist layer 15 to expose the substrate 10, as shown in FIG. 15A. In other embodiments, where the photoresist is a positive-tone resist, the exposed portion of the photoresist layer 50 is removed by the developer 57 forming a pattern of openings 55b in the photoresist layer 15 to expose the substrate 10, as shown in FIG. 15B.

Figure 16B:
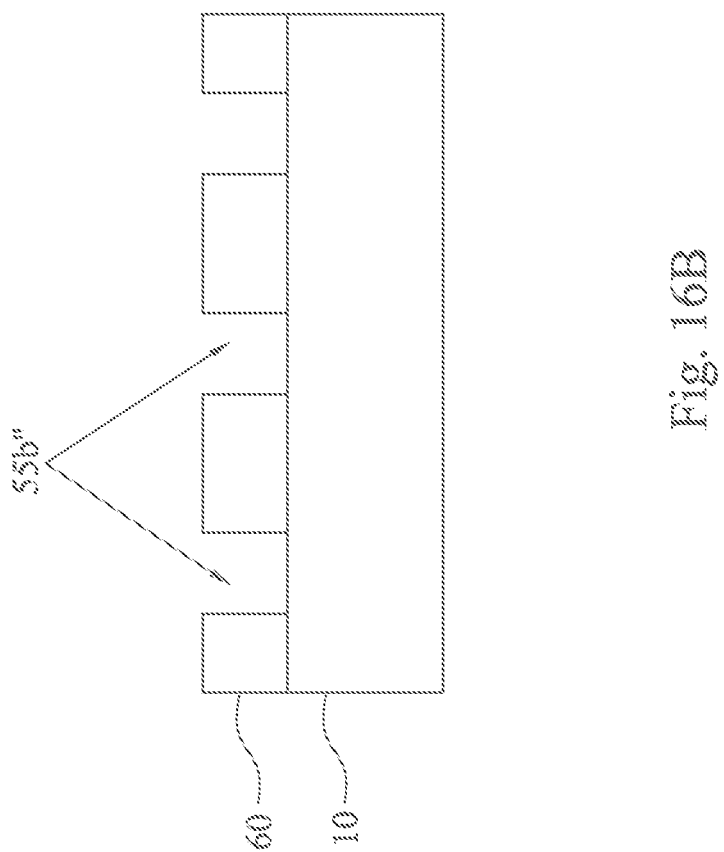

Then as shown in FIGS. 16A and 16B, the pattern 55a, 55b in the photoresist layer 15 is transferred to the layer to be patterned 60 using an etching operation and the photoresist layer is removed, as explained with reference to FIGS. 10A and 10B to form the pattern 55a", 55b" in the layer to be patterned 60.

Figure 17:
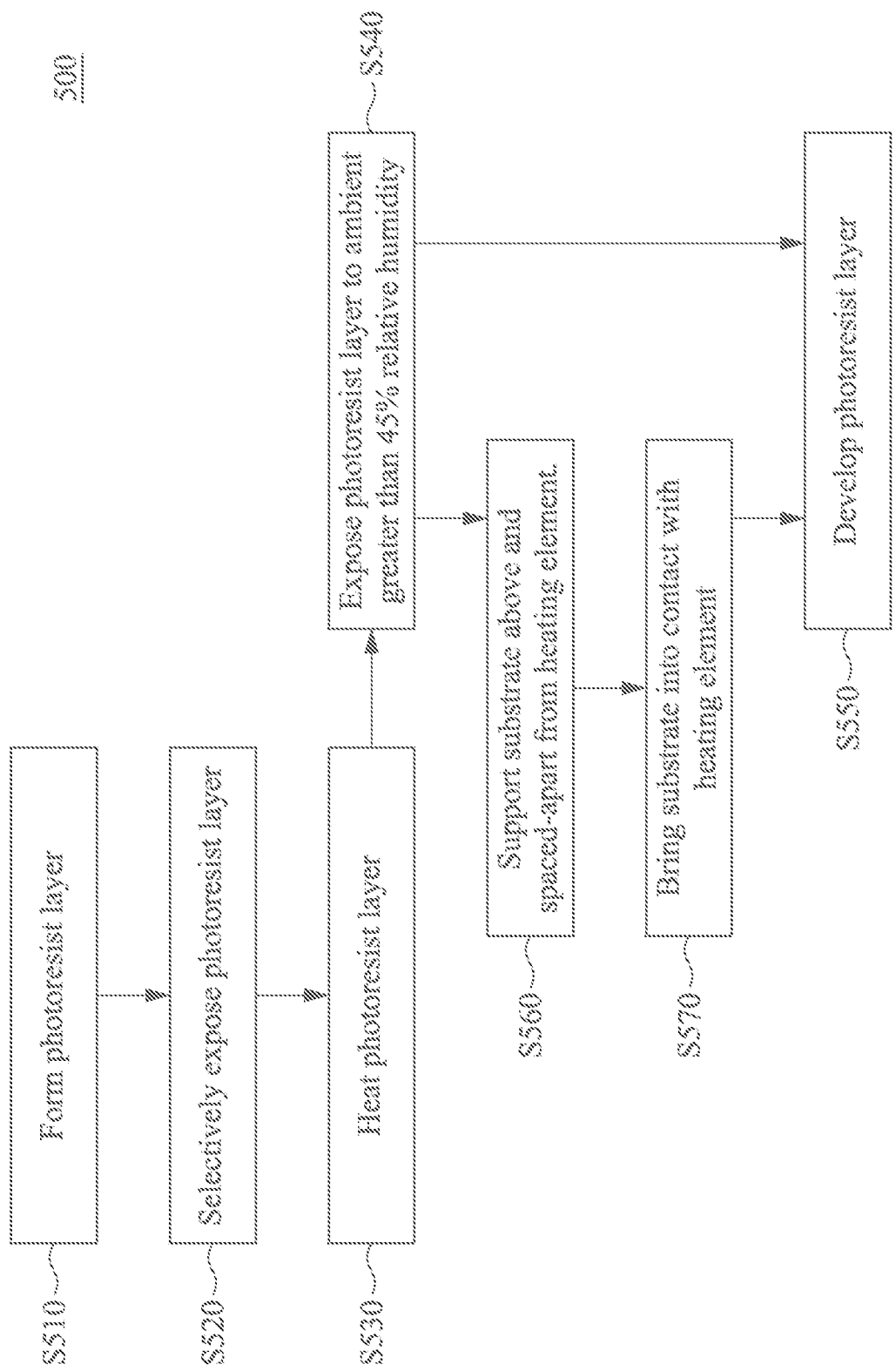
FIG. 17 is a flowchart of a method according to embodiments of the disclosure.

A method 500 of manufacturing a semiconductor device is illustrated in the flowchart of FIG. 17. A photoresist layer 15 is formed over a substrate 10 in operation S510. The photoresist layer 15 is selectively exposed to actinic radiation in operation S520. Then, in operation S530, the photoresist layer 15 is heated after selectively exposing the photoresist layer to actinic radiation. During the heating, the photoresist layer 15 is exposed to an ambient of greater than 45% relative humidity in operation S540. In operation S550, the photoresist layer 15 is developed after the heating to form a pattern 55 in the photoresist layer. In some embodiments, during the heating the photoresist layer, the substrate 10 is supported above and spaced-apart from a surface of a heating element 200 in operation S560. Then, in some embodiments, the substrate 10 is brought into contact with the heating element 200 in operation S570.

Figure 18:
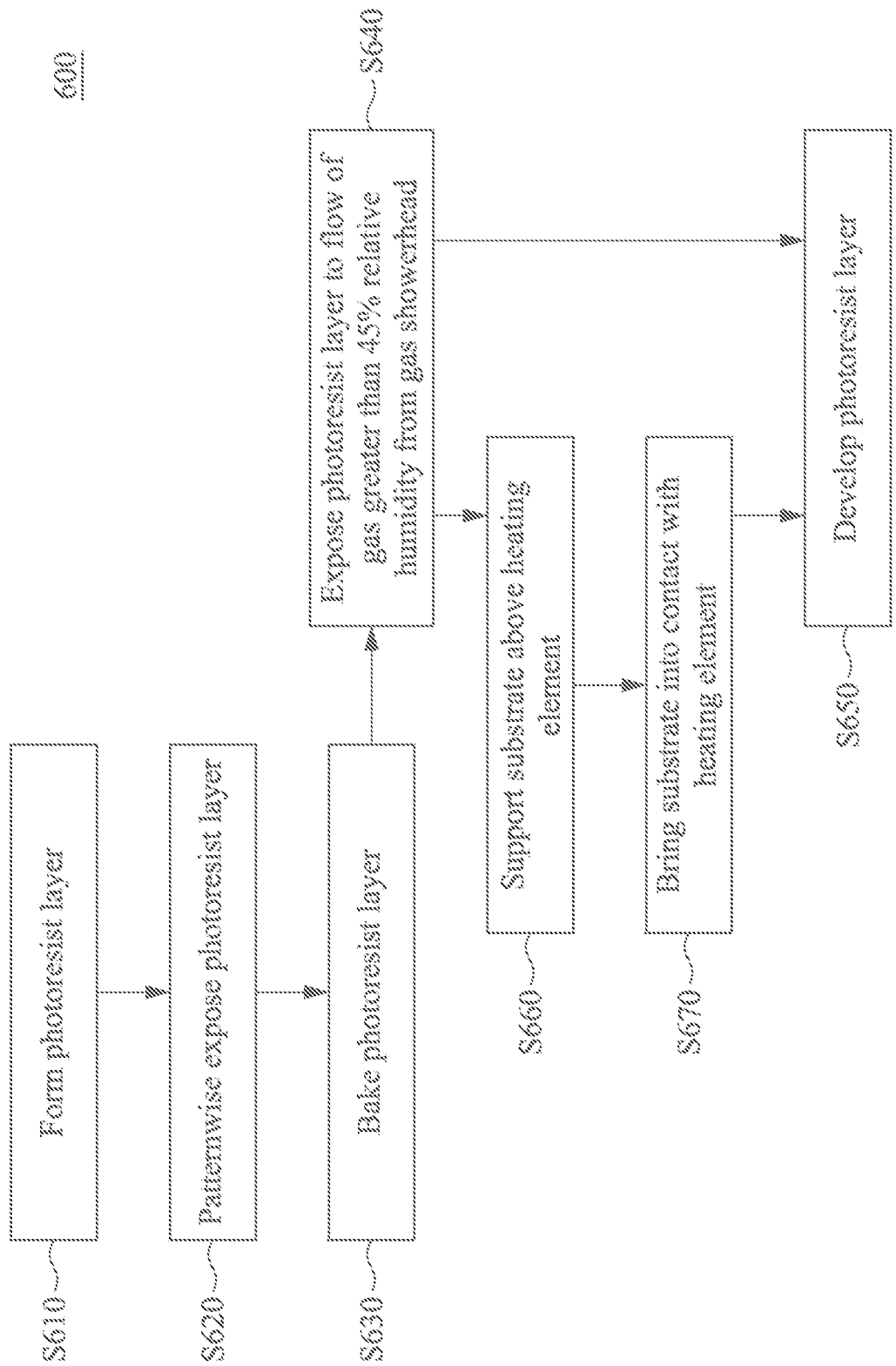
FIG. 18 is a flowchart of a method according to embodiments of the disclosure.

Another method 600 of manufacturing a semiconductor device is illustrated in FIG. 18. A photoresist layer 15 is formed over a substrate 10 in operation S610. The photoresist layer 15 is patternwise exposed to actinic radiation in operation S620. Then, in operation S630, the photoresist layer 15 is baked after patternwise exposing the photoresist layer to actinic radiation. During the heating, the photoresist layer 15 is exposed to a flow of gas of greater than 45% relative humidity from a gas showerhead in operation S640. In operation S650, the photoresist layer 15 is developed after the heating to form a pattern 55 in the photoresist layer. In some embodiments, during the heating the photoresist layer, the substrate 10 is supported above a heating element 200 in operation S660. Then, in some embodiments, the substrate 10 is brought into contact with the heating element 200 in operation S670.

Figure 19:
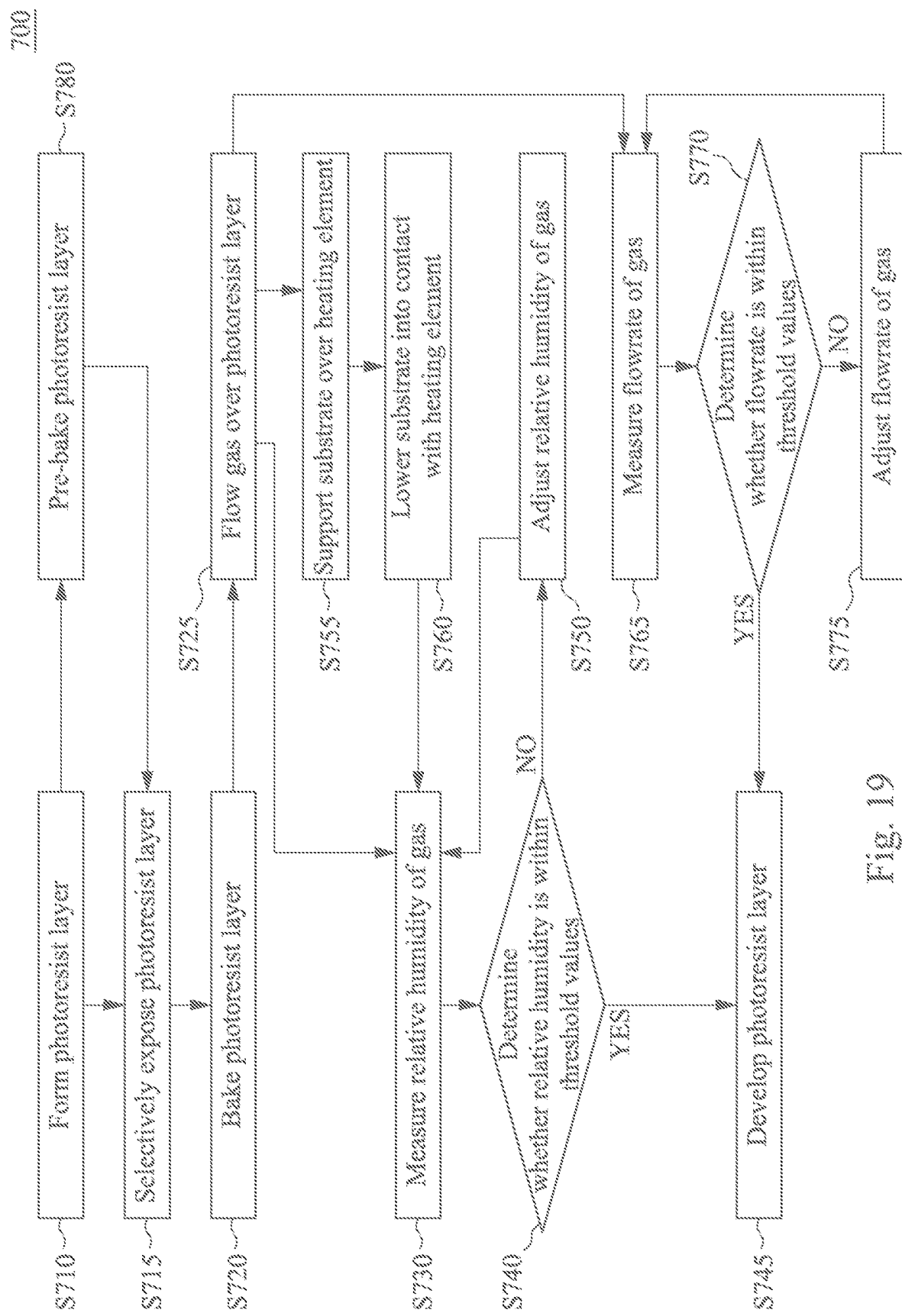
FIG. 19 is a flowchart of a method according to embodiments of the disclosure.

Another method 700 of manufacturing a semiconductor device is illustrated in FIG. 19. A photoresist layer 15 is formed over a substrate 10 in operation S710. The photoresist layer 15 is selectively exposed to actinic radiation in operation S715. Then, in operation S720, the photoresist layer 15 is baked after selectively exposing the photoresist layer to actinic radiation. During the baking, a gas is flowed over the photoresist layer 15 in operation S725. A relative humidity of the gas is measured in operation S730. Whether the relative humidity of the gas is below a lower threshold value or above an upper threshold value is determined in operation S740. Then, in operation S745, the photoresist layer 15 is developed in operation S745 if the relative humidity is within the range of threshold values. If the relative humidity is not within the range of threshold values, the relative humidity of the gas is adjusted in operation S750, and then the relative humidity of the gas is measured again and whether the relative humidity is within the range of threshold values is again determined.

In some embodiments, during the baking, the substrate is supported over and spaced-apart from a heating element in operation S755. Then, in operation S760, the method lowering the substrate so that it is in contact with the substrate during the baking operation S720.

In some embodiments, the method 700 includes during the baking operation S720, measuring a flowrate of the gas in operation S765, and then determining whether the flowrate of the gas is lower than a lower threshold value or greater than upper threshold value in operation S770. If the flowrate of the gas is within the threshold values, the photoresist is developed in operation S745. If the gas flowrate is not within the range of threshold values, the flowrate of the gas is adjusted in operation S775, and then the gas flowrate is measured again and whether the gas flowrate is within the range of threshold values is again determined.

As shown in FIG. 20, photoresist patterns formed according to embodiments of the present disclosure have improved critical dimension uniformity, while maintaining good line width roughness. In addition, photoresist coated substrates according to embodiments of the disclosure tolerate longer post-exposure bake delay times than photoresist coated substrates that are not processed in accordance with embodiments of the disclosure. As shown in FIG. 20, Trials #1 and #2 provide improved critical dimension uniformity (CDU) at delay times between post-exposure bake (PEB) and development up to 24 hours compared to a delay time of up to 3 hours for devices formed by conventional techniques. The "Normalized CDU" is the 3 sigma critical dimension uniformity of photolithographically patterned devices formed according to embodiments of the disclosure relative to photolithographically patterned devices formed according to conventional techniques. The "Range" is the difference between the maximum CD mean and the minimum CD mean, and "Normalized LWR" is the line width roughness of photolithographically patterned devices formed according to embodiments of the disclosure relative to photolithographically patterned devices formed according to conventional techniques. The comparative examples formed by conventional techniques only had up to a 3 hour time delay between post-exposure baking and development compared to up to a 21 hour time delay for Trials #1 and #2.

The "Normalized CD Mean Range" is the CD mean range after a 24 hour time delay between post-exposure baking and development (PEB delay) of photolithographically patterned devices formed according to embodiments of the disclosure relative to photolithographically patterned devices formed according to conventional techniques and a 24 hour PEB delay.

As shown in FIG. 20, there is a significant and unexpected improvement in the normalized CDU and the normalized CD mean range after a 24 hour delay between post-exposure baking and development, while maintaining line width roughness comparable with devices formed by conventional techniques that only have a 3 hour PEB delay.

The novel photolithographic patterning methods according to the present disclosure provide higher semiconductor device feature resolution and density at higher wafer exposure throughput with reduced defects in a higher efficiency process than conventional exposure techniques. Embodiments of the present disclosure extend the post-exposure bake delay tolerance up to 24 hours without sacrificing critical dimension and line width roughness performance. Embodiments of the present disclosure minimize turbulence of the humid gas flow, and provide improved temperature control of the photoresist coated substrate during the post-exposure bake operation. After development inspection of the critical dimension uniformity (CDU) is improved, and higher yield of semiconductor devices and higher quality semiconductor devices are obtained from methods according to the present disclosure. Embodiments of the present disclosure enable the use of a stand alone track processing configuration and enables the processing of wafers at higher wafer throughput and improves processing configuration flexibility. In addition, embodiments of the disclosure reduce cross-contamination from mixed runs of other photoresist coated wafers.

An embodiment of the disclosure is a method of manufacturing a semiconductor device, including forming a photoresist layer including a photoresist composition over a substrate. The photoresist layer is selectively exposed to actinic radiation. The photoresist layer is heated after selectively exposing the photoresist layer to actinic radiation. During the heating, the photoresist layer is exposed to an ambient of greater than 45% relative humidity. The photoresist layer is developed after the heating to form a pattern in the photoresist layer. In an embodiment, the photoresist layer is exposed to an ambient of 50% to 95% relative humidity during the heating. In an embodiment, during the heating, the photoresist layer is heated at a temperature ranging from 40° C. to 175° C. In an embodiment, during the heating, the photoresist layer is heated at a temperature ranging from 60° C. to 160° C. In an embodiment, during the heating the photoresist layer is heated for 45 seconds to 180 seconds. In an embodiment, during the heating, the photoresist layer the substrate is supported above and spaced-apart from a surface of a heating element. In an embodiment, during the heating, the substrate is supported above and spaced-apart from the heating element for 15 seconds to 60 seconds, and then brought into contact with the heating element. In an embodiment, the ambient of greater than 45% relative humidity is flowed over a main surface of the photoresist layer. In an embodiment, the photoresist composition includes: a polymer; metal particles; and a photoactive compound. In an embodiment, the photoresist composition further includes a ligand, wherein the ligand is a substituted or unsubstituted, branched or unbranched, aliphatic or aromatic, carboxylic acid or sulfonic acid ligand, wherein substituents are selected from the group consisting of C1-C9 alkyl, alkenyl, and phenyl groups. In an embodiment, each metal particle is complexed by 1 to 25 ligand units. In an embodiment, each metal particle is complexed by 1 to 18 ligand units. In an embodiment, the metal particles are complexed into metallic cores comprising up to 18 metal particles. In an embodiment, the photoresist composition further includes a solvent selected from the group consisting of propylene glycol methyl ether acetate (PGMEA), propylene glycol monomethyl ether (PGME), 1-ethoxy-2-propanol (PGEE), γ-butyrolactone (GBL), cyclohexanone (CHN), ethyl lactate (EL), methanol, ethanol, propanol, n-butanol, acetone, dimethylformamide (DMF), isopropanol (IPA), tetrahydrofuran (THF), methyl isobutyl carbinol (MIBC), n-butyl acetate (nBA), and 2-heptanone (MAK). In an embodiment, a concentration of the metal particles or carbon particles ranges from 0.5 wt. % to 15 wt. % based on the weight of the solvent and the metal particles. In an embodiment, the concentration of the metal particles or carbon particles ranges from 1 wt. % to 7 wt. % based on the weight of the solvent and the metal particles or carbon particles. In an embodiment, during the heating, the substrate is supported at a height of 0.5 mm to 10 mm above a surface of a heating element. In an embodiment, wherein during the heating, the substrate is supported at a height of 1 mm to 8 mm above a surface of a heating element. In an embodiment, wherein during the heating, the substrate is supported at a height of 2 mm to 6 mm above a surface of a heating element. In an embodiment, wherein the substrate is supported above and spaced-apart from the heating element for 15 seconds to 60 seconds. In an embodiment, the substrate is supported above and spaced-apart from the heating element for 20 seconds to 45 seconds. In an embodiment, the substrate is a semiconductor wafer. In an embodiment, during the heating, the substrate is supported above and spaced-apart from the heating element for 20 seconds to 40 seconds, and then brought into contact with the heating element. In an embodiment, the metal particles are nanoparticles. In an embodiment, the metal particles are one or more of titanium, zinc, zirconium, nickel, cobalt, manganese, copper, iron, strontium, tungsten, vanadium, chromium, tin, hafnium, indium, cadmium, molybdenum, tantalum, niobium, aluminum, cesium, barium, lanthanum, cerium, indium, silver, antimony, oxides thereof, and combinations thereof. In an embodiment, the metal particles include metal oxides. In an embodiment, the metal particles are metal oxide nanoparticles.

Another embodiment of the disclosure is a method of manufacturing a semiconductor device, including forming a photoresist layer comprising a photoresist composition over a substrate. The photoresist layer is patternwise exposed to actinic radiation. The photoresist layer is baked after patternwise exposing the photoresist layer to actinic radiation. During the baking the photoresist layer, the photoresist layer is exposed to a flow of a gas having greater than 45% relative humidity from a gas showerhead located over a main surface of the photoresist layer. The photoresist layer is developed after the baking the photoresist layer to form a pattern in the photoresist layer. In an embodiment, a surface of the showerhead facing the photoresist layer is spaced-apart from the main surface of the photoresist layer by a distance ranging from 1 mm to 25 mm. In an embodiment, the gas having greater than 45% relative humidity is supplied over the photoresist layer at a flow rate ranging from 1 L/min to 25 L/min. In an embodiment, during the baking, the substrate is supported at a height of 0.5 mm to 10 mm above a surface of a heating element. In an embodiment, the substrate is supported above and spaced-apart from the heating element for 20 seconds to 40 seconds, and then bringing the substrate into contact with the heating element during the baking operation.

In another embodiment, a semiconductor device manufacturing tool includes a processing chamber, and a heating element disposed inside the chamber. A plurality of support pins disposed inside the chamber is configured to support a semiconductor substrate over the heating element, wherein the plurality of support pins are configured to raise and lower the semiconductor substrate. A gas inlet is disposed in the processing chamber. A controller is configured to control: a flow rate of a gas supplied through the gas inlet; a humidity of the gas supplied through the gas inlet; a temperature of the heating element; and motion of the plurality of the support pins along a vertical direction. In an embodiment, the semiconductor device manufacturing tool includes a source of the gas supplied through the gas inlet. In an embodiment, the semiconductor device manufacturing tool includes a vacuum pump communicating with the processing chamber. In an embodiment, the semiconductor device manufacturing tool includes a humidifier/dehumidifier in a gas line supplying the gas to the gas inlet. In an embodiment, the semiconductor device manufacturing tool includes a humidity sensor in the processing chamber.

Another embodiment of the disclosure is a method of manufacturing a semiconductor device, including forming a photoresist layer including a photoresist composition over a substrate. The photoresist layer is selectively exposed to actinic radiation. The photoresist layer is baked after selectively exposing the photoresist layer to actinic radiation. During the baking, a gas is flowed over the photoresist layer. A relative humidity of the gas is measured. Whether the relative humidity of the gas is below a lower threshold value or above an upper threshold value is determined. The relative humidity of the gas is adjusted when the relative humidity of the gas is below the lower threshold or above the upper threshold value so that the relative humidity of the gas is between the lower threshold value and the upper threshold value. The photoresist layer is developed after the baking to form a pattern in the photoresist layer. In an embodiment, the method includes during the baking, supporting the substrate over and spaced-apart from a heating element. In an embodiment, the method includes during the baking lowering the substrate so that it is in contact with the substrate. In an embodiment, the method includes during the baking: measuring a flowrate of the gas, determining whether the flowrate of the gas is lower than a lower threshold value or greater than upper threshold value, adjusting the flowrate of the gas when the flowrate is lower than the lower threshold value or greater than the upper threshold value so that the flowrate of the gas is between the lower threshold value and the upper threshold value. In an embodiment, the heating element is a hot plate. In an embodiment, the gas comprises air, nitrogen, argon, helium, neon, or carbon dioxide. In an embodiment, the method includes pre-baking the photoresist layer before selectively exposing the photoresist layer to actinic radiation. In an embodiment, the actinic radiation includes extreme ultraviolet radiation.

Another embodiment of the disclosure is a semiconductor device manufacturing tool, includes a processing chamber, and a heating element disposed inside the chamber. A plurality of support pins disposed inside the chamber is configured to support a semiconductor substrate over the heating element, wherein the plurality of support pins are configured to raise and lower the semiconductor substrate. A gas showerhead is disposed over the heating element. A controller is configured to control a flow rate of a gas supplied through the gas showerhead, a temperature of the heating element; and motion of the plurality of the support pins along a vertical direction. In an embodiment, the semiconductor device manufacturing tool includes a source of the gas supplied through the gas showerhead. In an embodiment, the semiconductor device manufacturing tool includes a vacuum pump communicating with the processing chamber. In an embodiment, the semiconductor device manufacturing tool includes a humidifier/dehumidifier in a gas line supplying the gas to the showerhead. In an embodiment, the semiconductor device manufacturing tool includes a humidity sensor in the processing chamber. In an embodiment, the showerhead includes a plurality of openings through which the gas flows, and the plurality of openings are arranged in a row and column arrangement. In an embodiment, each of the plurality of openings has a diameter ranging from 0.1 mm to 10 mm. In an embodiment, the plurality of openings has a pitch ranging from 0.5 mm to 24 mm.

Another embodiment of the disclosure is a semiconductor device manufacturing tool, including a chamber, and a heating element disposed inside the chamber. A plurality of support pins disposed inside the chamber is configured to support a semiconductor substrate over the heating element, wherein the plurality of support pins are configured to raise and lower the semiconductor substrate. A gas showerhead is disposed over the heating element. A gas supply and a humidifier/dehumidifier connected to a gas supply line connecting the gas supply to the gas showerhead. A controller is configured to control: a relative humidity of the gas supplied through the gas showerhead, a flow rate of a gas supplied through the gas showerhead, a temperature of the heating element, and motion of the plurality of the support pins along a vertical direction. In an embodiment, the semiconductor device manufacturing tool includes a vacuum pump communicating with the processing chamber. In an embodiment, the semiconductor device manufacturing tool includes a humidity sensor in the processing chamber. In an embodiment, the showerhead includes a plurality of openings through which the gas flows, and the plurality of openings are arranged in a row and column arrangement. In an embodiment, each of the plurality of openings has a diameter ranging from 0.1 mm to 10 mm. In an embodiment, each of the plurality of openings has a diameter ranging from 1 mm to 5 mm. In an embodiment, the plurality of openings has a pitch ranging from 0.5 mm to 24 mm. In an embodiment, the plurality of openings has a pitch ranging from 3 mm to 10 mm.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

pattern in the photoresist layer.

What is claimed is:

1. A method of manufacturing a semiconductor device, comprising:

forming a photoresist layer comprising a photoresist composition over a substrate;

selectively exposing the photoresist layer to actinic radiation;

heating the photoresist layer in a processing chamber after selectively exposing the photoresist layer to actinic radiation, wherein during the heating, exposing the photoresist layer to an ambient of 75% to 95% relative humidity in the processing chamber and the photoresist layer is heated at a temperature ranging from 100° C. to 175° C., the ambient of 75% to 95% relative humidity is flowed over a main surface of the photoresist layer, and during the heating, the temperature and the relative humidity are controlled by a controller programmed to control the temperature and the relative humidity; and developing the photoresist layer after the heating to form a pattern in the photoresist layer, wherein the photoresist composition comprises:

a polymer;

metal nanoparticles having an average particle size ranging from 1 nm to 20 nm, wherein the metal nanoparticles are selected from the group consisting of titanium, zinc, zirconium, nickel, cobalt, manganese, copper, strontium, tungsten, vanadium, chromium, tin, hafnium, indium, cadmium, molybdenum, tantalum, niobium, cesium, barium, lanthanum, cerium, indium, silver, antimony, oxides thereof, and combinations thereof;

a ligand, wherein the ligand is a C1-C7 alkyl group or C1-C7 fluoroalkyl group including one or more substituents selected from the group consisting of —SH, —S—, —P—, —PO$_2$, —C(=O)SH, —C(=O)NH, and —SO$_2$SH; and a photoactive compound.

2. The method according to claim 1, wherein during the heating, the photoresist layer is heated for 45 seconds to 180 seconds.

3. The method according to claim 1, wherein during the heating, supporting the substrate above and spaced-apart from a surface of a heating element.

4. The method according to claim 3, wherein during the heating, supporting the substrate above and spaced-apart from the heating element for 15 seconds to 60 seconds, and then bringing the substrate into contact with the heating element, wherein movement of the substrate towards and away from the heating element is controlled by the controller.

5. A method of manufacturing a semiconductor device, comprising:

forming a photoresist layer comprising a photoresist composition over a substrate;

patternwise exposing the photoresist layer to actinic radiation;

baking the photoresist layer in a processing chamber after patternwise exposing the photoresist layer to actinic radiation at a temperature ranging from 100° C. to 175° C., wherein during the baking the photoresist layer, exposing the photoresist layer to a flow of a gas having 75% to 95% relative humidity in the processing chamber from a gas showerhead located over a main surface of the photoresist layer, wherein the gas having 75% to 95% relative humidity is supplied over the photoresist layer at a flow rate ranging from 3 L/min to 12 L/min, and during the baking the photoresist layer, the temperature, humidity, and flow rate of the gas through the showerhead are controlled by a controller programmed to control the temperature, humidity, and flow rate of the gas; and developing the photoresist layer after the baking the photoresist layer to form a pattern in the photoresist layer, wherein the photoresist composition comprises:

a polymer;

metal particles, wherein the metal particles are nanoparticles selected from the group consisting of titanium, zinc, zirconium, nickel, cobalt, manganese, copper, strontium, tungsten, vanadium, chromium, tin, hafnium, indium, cadmium, molybdenum, tantalum, niobium, cesium, barium, lanthanum, cerium, indium, silver, antimony, oxides thereof, and combinations thereof;

a ligand, wherein the ligand is a substituted or unsubstituted, branched or unbranched, aliphatic or aromatic, carboxylic acid ligand, wherein substituents are selected from the group consisting of C1-C9 alkyl, alkenyl, and phenyl groups; and a photoactive compound.

6. The method according to claim 5, wherein a surface of the showerhead facing the photoresist layer is spaced-apart from the main surface of the photoresist layer by a distance ranging from 1 mm to 25 mm.

7. The method according to claim 5, wherein during the baking, the substrate is supported at a height of 0.5 mm to 10 mm above a surface of a heating element.

8. The method according to claim 7, wherein the substrate is supported above and spaced-apart from the heating element for 20 seconds to 40 seconds, and then brought into contact with the heating element during the baking, wherein movement of the substrate towards and away from the heating element is controlled by the controller.

9. A method of manufacturing a semiconductor device, comprising:

forming a photoresist layer comprising a photoresist composition over a substrate;

selectively exposing the photoresist layer to actinic radiation;

baking the photoresist layer in a processing chamber after selectively exposing the photoresist layer to actinic radiation at a temperature ranging from 100° C. to 175° C., wherein during the baking:

flowing a gas over the photoresist layer;

measuring a relative humidity of the gas in the processing chamber;

determining whether the relative humidity of the gas in the processing chamber is below a lower threshold value or above an upper threshold value, wherein the lower threshold value is 75% relative humidity and the upper threshold value is 95% relative humidity;

adjusting the relative humidity of the gas when the relative humidity of the gas is below the lower threshold or above the upper threshold value so that the relative humidity of the gas is between the lower threshold value and the upper threshold value;

measuring a flowrate of the gas;

determining whether the flowrate of the gas is lower than a lower threshold value or greater than upper threshold value; and adjusting the flowrate of the gas when the flowrate is lower than the lower threshold value or greater than the upper threshold value so that the flowrate of the gas is between the lower threshold value and the upper threshold value, wherein the gas is supplied over the photoresist layer at a flow rate ranging from 3 L/min to 12 L/min, wherein the temperature, flowing the gas, measuring the relative humidity, determining relative humidity, and adjusting the relative humidity are controlled by a controller programmed to control the temperature, flowing the gas, measuring the relative humidity, determining relative humidity, and adjusting the relative humidity; and developing the photoresist layer after the baking to form a pattern in the photoresist layer, wherein the photoresist composition comprises:

a polymer;

metal particles, wherein the metal particles are nanoparticles selected from the group consisting of titanium, zinc, zirconium, nickel, cobalt, manganese, copper, strontium, tungsten, vanadium, chromium, tin, hafnium, indium, cadmium, molybdenum, tantalum, niobium, cesium, barium, lanthanum, cerium, indium, silver, antimony, oxides thereof, and combinations thereof;

a ligand, wherein the ligand is a substituted or unsubstituted, branched or unbranched, aliphatic or aromatic, carboxylic acid ligand, wherein substituents are selected from the group consisting of C1-C9 alkyl, alkenyl, and phenyl groups; and a photoactive compound.

10. The method according to claim 9, further comprising during the baking supporting the substrate over and spaced-apart from a heating element.

11. The method according to claim 10, further comprising during the baking lowering the substrate so that it is in contact with the heating element, wherein the lowering the substrate is controlled by the controller.

12. The method according to claim 9, further comprising pre-baking the photoresist layer before selectively exposing the photoresist layer to actinic radiation.

13. The method according to claim 1, wherein each metal particle is complexed by 1 to 25 ligand units.

14. The method according to claim 5, wherein each metal particle is complexed by 1 to 25 ligand units.

15. The method according to claim 9, wherein each metal particle is complexed by 1 to 25 ligand units.

16. The method according to claim 1, wherein the metal nanoparticles have an average particle size ranging from 2 nm to 5 nm.

17. The method according to claim 1, wherein the polymer is

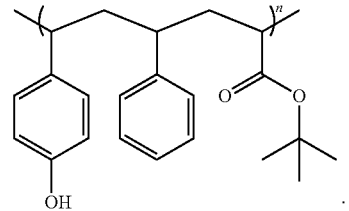

18. The method according to claim 9, wherein the metal are nanoparticles having an average particle size ranging from 1 nm to 20 nm.

19. The method according to claim 1, wherein the ligand is a C1-C7 alkyl group or C1-C7 fluoroalkyl group including one or more substituents selected from the group consisting of —P—, —PO$_2$, and —C(=O) NH.

* * * * *